(12) United States Patent
Shimada et al.

(10) Patent No.: US 6,746,969 B2
(45) Date of Patent: Jun. 8, 2004

(54) METHOD OF MANUFACTURING SEMICONDUCTOR DEVICE

(75) Inventors: Miyoko Shimada, Yokohama (JP); Hideshi Miyajima, Yokohama (JP); Rempei Nakata, Kamakura (JP); Hideto Matsuyama, Yokohama (JP); Katsuya Okumura, Tokyo (JP); Masahiko Hasunuma, Yokohama (JP); Nobuo Hayasaka, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/982,003

(22) Filed: Oct. 19, 2001

(65) Prior Publication Data

US 2002/0081863 A1 Jun. 27, 2002

(30) Foreign Application Priority Data

Oct. 20, 2000 (JP) ........................ 2000-320680
Mar. 30, 2001 (JP) ........................ 2001-098182
Mar. 30, 2001 (JP) ........................ 2001-098183
Oct. 19, 2001 (JP) ........................ 2001-321448

(51) Int. Cl.$^7$ .............................................. H01L 21/31
(52) U.S. Cl. ..................... 438/778; 438/618; 438/623; 438/687; 438/781; 438/787; 438/790; 438/795; 257/506; 257/644
(58) Field of Search ............................... 257/506, 644; 438/618, 623, 687, 778, 781, 787, 790, 795

(56) References Cited

U.S. PATENT DOCUMENTS

| | | | | |
|---|---|---|---|---|
| 4,222,792 A | * | 9/1980 | Lever et al. ............... | 257/506 |
| 5,003,178 A | | 3/1991 | Livesay | |
| 5,306,739 A | * | 4/1994 | Lucey ....................... | 522/42 |
| 5,376,586 A | * | 12/1994 | Beilin et al. ............ | 204/157.64 |
| 5,989,983 A | | 11/1999 | Goo et al. | |
| 6,132,814 A | * | 10/2000 | Livesay et al. ........... | 438/787 |

FOREIGN PATENT DOCUMENTS

| | | |
|---|---|---|
| JP | 10-107026 | 4/1998 |
| JP | 10-303190 | 11/1998 |
| JP | 11-505670 | 5/1999 |
| JP | 11-506872 | 6/1999 |
| WO | WO-96/36070 A2 * 11/1996 | ......... H01L/21/316 |

OTHER PUBLICATIONS

Nobuhide Yamada et al., "Method for Manufacturing Semiconductor Device", U.S. Ser. No. 09/604,726., filed Jun. 28, 2000.

* cited by examiner

*Primary Examiner*—Kamand Cuneo
*Assistant Examiner*—Lisa Kilday
(74) *Attorney, Agent, or Firm*—Finnegan, Henderson, Farabow, Garrett & Dunner, L.L.P.

(57) ABSTRACT

A method of manufacturing a semiconductor device comprises preparing a substrate to be treated, and forming an insulation film above the substrate, which includes applying an insulation film raw material above the substrate, the insulation film raw material including a substance or a precursor of the substance, the insulation film comprising the substance, curing the insulation film raw material by irradiating an electron beam on the substrate while heating the substrate in a reactor chamber, changing at least one of parameter selected from the group consisting of pressure in the reactor chamber, temperature of the substrate, type of gas having the substrate exposed thereto, flow rate of gas introduced into the reactor chamber, position of the substrate, and quantity of electrons incident to the substrate per unit time when the electron beam is being irradiated on the substrate.

27 Claims, 8 Drawing Sheets

METHOD OF MANUFACTURING SEMICONDUCTOR DEVICE

CROSS-REFERENCE TO RELATED APPLICATIONS

This application is based upon and claims the benefit of priority from the prior Japanese Patent Applications No. 2000-320680, filed Oct. 20, 2000; No. 2001-098182, filed Mar. 30, 2001; No. 2001-098183, filed Mar. 30, 2001; and No. 2001-321448, filed Oct. 19, 2001, the entire contents of all of which are incorporated herein by reference.

BACKGROUND OF THE INVENTION

1. Field of the Invention

The present invention relates to a method of manufacturing a semiconductor device. More particularly, the present invention relates to a method of manufacturing a semiconductor device having an insulation film formed by a coating technique.

2. Description of the Related Art

As wiring dimensions are changing smaller with a miniaturization of a semiconductor element, a parasitic capacity is increasing. In recent years, an increase in inter-wiring capacity of such type have a great effect on an operating speed of the device.

Conventionally, a silicon oxide film formed by a thermal CVD or plasma CVD has been employed as an interlayer insulation film of the semiconductor device. However, in recent years, in order to reduce an interlayer capacity, it is required to apply a low permittivity film such as an organic silicon oxide film or an organic film without silicon to the interlayer insulation film.

A relative dielectric constant of a general silicon oxide film (P—$SiO_2$) obtained by conventional plasma CVD is about 4.1. In addition, the relative dielectric constant of a silicon oxide film obtained by adding fluorine (P) to the silicon oxide film (P—$SiO_2$) is 3.3. This is a lowest limit of the relative dielectric constant of the insulation film formed by the thermal CVD or plasma CVD.

In contrast, an interlayer insulation film with about 2.4 to 2.8 in relative dielectric constant can be achieved by using a low relative dielectric constant film such as the organic silicon oxide film. However, in actuality, there are a variety of problems in practical use of these low relative dielectric constant films. As one of such serious problems, there can be exemplified a lower mechanical strength of the film. If the mechanical strength of the film is low, a crack occurs with the film during film forming and after film forming or an exfoliation of the film occurs during a CMP process. If such the crack or exfoliation occurs, it is difficult to produce a wire with its high reliability.

Most of the low relative dielectric constant film such as the organic silicon oxide film is formed by a process using coating. In the process, for instance, a liquid-like raw material called vanish in which a precursor of a substance comprising the low relative dielectric constant film is dissolved in solvent is applied on a substrate to be treated, and then, the liquid-like raw material is heated, thereby ensuring evaporation of a solvent volatile and bridge of the precursor. The precursor used here indicates a series of substances that is at a stage before a target product.

Now, the sequence of a process for forming an insulation film using a conventional coating technique will be specifically described below by way of example of a polymethyl siloxane film (organic silicon oxide film). An outline of the process is as follows (step "a" to "c").

Step "a": Applying of a vanish.

Step "b": Heat treatment at about 80 to 200° C. and for about one minute.

Step "c": Heat treatment at about 400 to 450° C. for about 30 to 60 minutes.

The above process will be described in detail. First, a vanish obtained by dissolving polymethyl siloxane in solvent is applied with a spin coating technique using a coater, and a coat film is formed (step "a"). Next, the substrate is heated at a temperature of 80 to 200° C. for one minute (step "b"). Finally, the substrate is heated at a temperature of 400 to 450° C. for 30 minutes (step "c"), and a polymethyl siloxane film is obtained.

In the above sequence (steps "a" to "c"), the step "b" is responsible for a treatment for solidifying a film material by solvent evaporation, and the step "c" is responsible for a treatment for forming a bridge between polymethyl siloxane molecules, respectively.

The characteristics of the polymethyl siloxane film formed by the process are described below.

In general, although such the insulation film is low in relative dielectric constant, the density is low, and/or a void concentration is high. Thus, the polymethyl siloxane film has a defect that its mechanical strength is low.

Further, when such an insulation film with low mechanical strength is formed by the above described process, there arises a problem that a crack at predetermined thickness or more occurs. The thickness of a limit that a crack does not occur is referred to as crack resistance film thickness.

Here, the characteristics of the interlayer insulation film of a semiconductor device is better when a relative dielectric constant is lower, and the crack resistance film thickness is larger. The above described polymethyl siloxane film formed by the conventional process is 1200 nm in crack resistance film thickness when the relative dielectric constant is 2.8. Therefore, the polymethyl siloxane film formed by the conventional process has not been sufficient as characteristics of the interlayer insulation film of the semiconductor device.

Here, factors for producing the crack in the polymethyl siloxane film with the low relative dielectric constant formed by the conventional process will be described below. Such factors for producing the crack are that an internal stress caused by film contraction during bridge reaction occurs in the film with the low mechanical strength, and a thermal stress is applied during film formation.

In the case of the polymethyl siloxane film, the bridge reaction occurs due to dehydrate condensation. During the bridge reaction, a film contraction occurs, and after the formation of the film, the film contraction results in a residual stress of the film. In addition, during the bridge reaction due to heat treatment, the film contraction occurs while a material is thermally expanded. Thus, when this film is cooled to room temperature, contraction due to the temperature fall is applied. As a result, the residual stress of the film is further increased. In addition, a thermal stress applied by the temperature rise and fall causes an increase of bridge defects or voids, whereby the mechanical strength of the film that is originally weak is further weakened.

Further, recently, as a method for curing a coat film, for example, as disclosed in Jpn. Pat. Appln. KOKAI Publication No. 10-303190, there is proposed a method for coating a resin, partially evaporating a solvent, irradiating the coat film with high energy rays at room temperature or the like to cure the coat film, and further, applying a high temperature heat treatment to the coat film. According to the above described method, an insulation film with its excellent coat properties and flatness is obtained.

However, in order to form silica (silicon oxide film) with excellent coverage properties and flatness by the above described method, a resin is irradiated with high energy rays of 165 keV. Although the coat film can be cured by irradiation of such high energy rays at high levels, a network with its structure of a precursor in the coat film cannot be deformed. That is, with the above described method, the permittivity of the coat film cannot be reduced, and desired mechanical strength cannot be provided to the coat film. Further, the above publication fails to describe and suggest the reduction of permittivity of the coat film.

Further, in the method for forming the coat film using only one of heat treatment and electronic irradiation, there is a problem that a long time is required until the bridge reaction of the precursor ends. For example, it takes about 30 minutes to 1 hour until the bridge reaction of the precursor ends.

BRIEF SUMMARY OF THE INVENTION

A method of manufacturing a semiconductor device comprises:

preparing a substrate to be treated; and forming an insulation film above the substrate, which includes applying an insulation film raw material above the substrate, the insulation film raw material including a substance or a precursor of the substance, the insulation film comprising the substance, curing the insulation film raw material by irradiating an electron beam on the substrate while heating the substrate in a reactor chamber, changing at least one of parameter selected from the group consisting of pressure in the reactor chamber, temperature of the substrate, type of gas having the substrate exposed thereto, flow rate of gas introduced into the reactor chamber, position of the substrate, and quantity of electrons incident to the substrate per unit time when the electron beam is being irradiated on the substrate.

DETAILED DESCRIPTION OF THE INVENTION

Figure 1A:
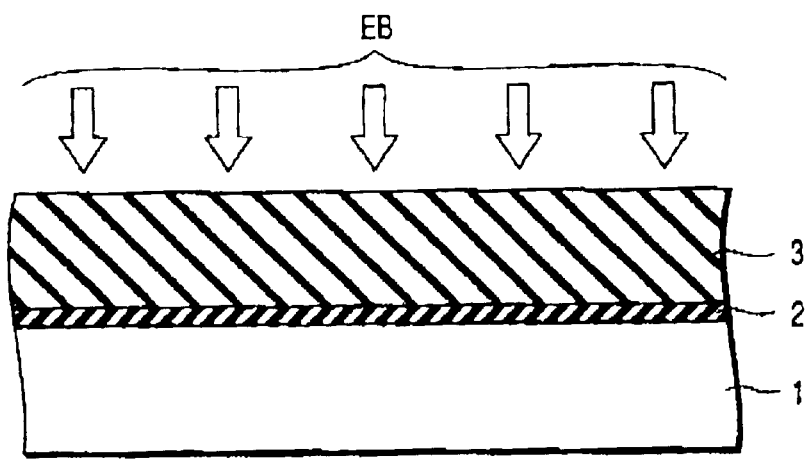
FIGS. 1A–1C show cross sectional views of a manufacturing process of a semiconductor device according to a first embodiment of the present invention.

Hereinafter, a description will be given with respect to a method for forming a coat film using heat treatment and electron beam irradiation treatment that is a basis of the present embodiments described below. In the above process, a liquid-like raw material (vanish) obtained by dissolving a film material or its precursor in solvent is applied on a substrate, and then, the liquid-like raw material applied on the substrate is cured by using heat treatment and electron beam irradiation treatment. Two typical examples of sequences of the method for forming the coat film are shown below.

[Sequence 1]
  Step 1: Coating
  Step 2: Heat treatment plus electron beam irradiation treatment

[Sequence 2]
  Step 1: Coating
  Step 2: Heat treatment plus an electron beam irradiation process
  Step 3: Heat treatment Now, an operation when the electron beam irradiation is used for forming an insulation film will be described here. The electron beam irradiation has the following characteristics that energy is applied to a film material as compared with heat treatment.

First, the electron beam can apply energy that is much greater than heat treatment to a film material. The energy applied by heat treatment is some eV or less at most. In contrast, the electron beam generally used for irradiation treatment or the like has energy of about 5 to 200 keV.

Of course, the electron beam advanced into the film material causes cascade due to collision, and loses energy while generating secondary electrons or X-rays. Because of this, all the energy originally possessed by the electron beam cannot always be directly associated with reaction. However, the energy applied by the electron beam to the film material is kept to be much greater as compared with that of heat treatment.

When the electron beam irradiation has been carried out, the energy that cannot be achieved by heat treatment is applied to the film material, whereby bridge reaction of the precursor of the film material can be effectively advanced or a molecule chain or group that can not be cut by thermal energy can be cut.

When the electron beam irradiation has been carried out, in general, inter-molecule bridge reaction and molecule chain cutting or group separation take place at the same time. Which of these reactions occur or what rate such reaction occurs at depends on type of material molecule. Further, the electron beam irradiation and heat treatment are combined with each other, whereby, even in the case where molecule chain cutting or group separation takes place, a cutting point is obtained as a new bridge point, and further, bridge advances.

As has been described above, such inter-molecule bridge reaction of a film material and molecule chain cutting or group separation that can not be achieved only by neat treatment can be carried out by using the electron beam irradiation treatment and heat treatment.

Advantageous effect when the electron beam irradiation is used for forming an insulation film with its low dielectric rate will be described based on operation of the above described electron beam irradiation. In bridge reaction due to the electron beam irradiation, high energy is applied, and thus, bridge reaction is effectively accelerated.

Further, effective bridge reaction can be carried out at a low temperature by using the electron beam irradiation. Because of this, an increase of bridge defects or voids due to a thermal stress of a temperature rise or fall is restrained, and a film with its high mechanical strength is formed.

In addition, from the viewpoint of a molecule structure, bridge at a bridge point that is different from bridge due to heat treatment can be carried out by using the electron beam irradiation treatment. Thus, a molecule structure with its high mechanical strength that cannot be achieved by heat treatment is considered to be produced.

With respect to curing of a coat film using the electron beam irradiation, for example, in PCT National Publication HEI No. 11-505670, as a method for curing an SOG material on a semiconductor substrate, there is disclosed a method for irradiating the SOG material with a electron beam while heating the SOG material at a temperature lower than about 250° C.

In addition, in PCT National Publication HEI No. 11-506872, as a method for curing a dielectric substrate such as siloxane on a silicon water, there is disclosed that a film having its excellent dielectric characteristics, density, or uniformity and the like can be obtained by using the electron beam irradiation.

Further, in Jpn. Pat. Appln. KOKAI Publication No. 10-107026, there is disclosed an SOG layer curing method for carrying out an insulation action between metal wires and flatting action by exposing the SOG layer to a electron beam, and then, curing the layer while heating the SOG layer that made of HSQ (Hydrogen silsesquioxan) at a temperature from a normal temperature to about 500° C.

In the present embodiment, as described later in detail, in a method for forming an insulation film in which the heat treatment step is combined with the electron beam irradiation treatment step, at least one of a plurality of predetermined parameters is changed during the electron beam irradiation of the electron beam irradiation treatment step.

The plurality of predetermined parameters include pressure in a reactor chamber, temperature of the substrate, type of gas having the substrate exposed thereto, flow rate of gas introduced into the reactor chamber, position of the substrate, and quantity of electrons incident to the substrate per unit time.

That is, the inventors found out a method for changing at least one of a plurality of predetermined parameters, thereby easily obtaining an insulation film with its low dielectric rate having excellent crack resistance properties and excellent durability in processes such as dry etching, dry icing, CMP, or the like.

The method according to the present embodiment is significantly different from methods disclosed in the previously described PCT National Publication HEI No. 11-505670, PCT National Publication HEI No. 11-506872, and Jpn. Pat. Appln. KOKAI Publication No. 10-107026 or the like in that predetermined parameters are thus changed during the electron beam irradiation treatment.

Further, as described below in detail, in a chamber that is the same as a reactor chamber for carrying out the electron beam irradiation treatment, at least one of pre-heat treatment and post-heat treatment may be carried out continuously together with the above coat film process. The above pre-heat treatment and post-heat treatment are accompanied by a change in at least one or more of a plurality of predetermined parameters.

The plurality of parameters includes pressure in the reactor chamber, temperature of the substrate, type of gas having the substrate exposed thereto, flow rate of the gas introduced into the reactor chamber, and position of the substrate.

The method according to the present embodiment is significantly different from methods disclosed in the previously described PCT National Publication HEI No. 11-505670, PCT National Publication HEI No. 11-506872, and Jpn. Pat. Appln. KOKAI Publication No. 10-107026 or the like in that the pre-heat treatment or post-heat treatment that is continuous carried out with the above electron beam irradiation, and the at least one parameters is changed during these treatments in a chamber that is the same as a reactor chamber for carrying out the electron beam irradiation treatment.

The cutting of a molecule chain of the film material or separation of groups occurs due to the electron beam irradiation. Further, bridge reaction is accelerated by heat treatment using the electron beam irradiation in combination, and a relationship between cutting and separation due to the electron beam irradiation is harmonized. As a result, a network structure with its high mechanical strength is produced in the film material, and crack resistance properties of the insulation film with its low dielectric rate is improved.

In the electron beam irradiation step, it is important to irradiate the inside of the film material with the electron beam of their proper dose so that the cutting of molecule chain or separation of groups that occurs at the same time as bridge is prevented from being excessively accelerated.

In the case of many coating materials, heat treatment is carried out prior to the electron beam irradiation treatment, and the film material due to solvent evaporation is actively solidified, whereby a better insulation film can often be formed.

Now, embodiments of the present invention will be described with reference to the accompanying drawings.
(First Embodiment)

Figure 1B:
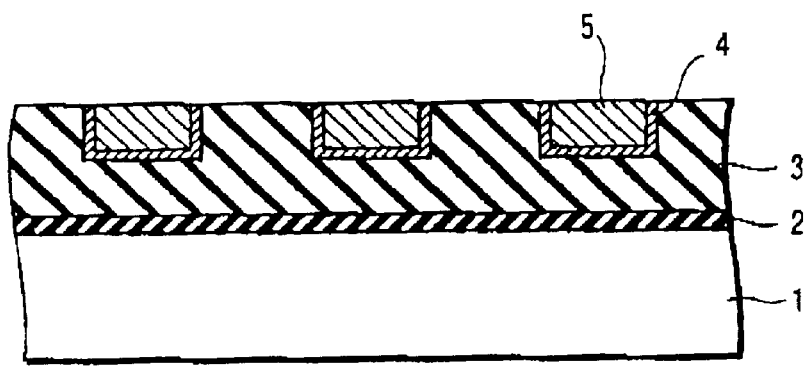
Figure 1C:
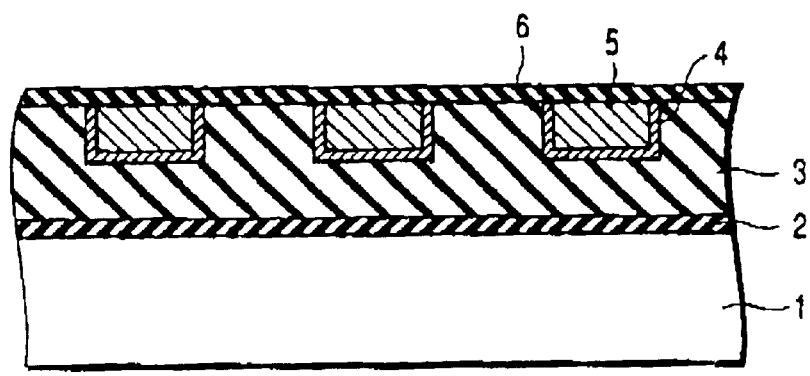

FIGS. 1A to 1C are cross sectional views showing the steps of manufacturing a semiconductor device according to a first embodiment of the present invention.

First, as shown in FIG. 1A, a base insulation film 2 is formed on a surface of a semiconductor substrate 1 having elements integrally formed thereon. Next, an interlayer insulation film 3 is formed on the base insulation layer 2 by using heating and the electron beam irradiation. A specific method for forming the interlayer insulation film 3 will be described later.

Next, as shown in FIG. 1B, a wiring groove with desired size and shape is formed at a predetermined portion of the interlayer insulation film 3, and a barrier metal 4 and a metal wire 5 are formed in a wiring groove by a conventional CMP process. In addition, the surface of the interlayer insulation film 3, barrier metal 4, and metal wire 5 is flattened. Here, a Cu wire whose main material is Cu is used as the metal wire 5.

Then, as shown in FIG. 1C, a barrier insulation film 6 having SiN or SiC is formed on the flattened surfaces of the interlayer insulation film 3, barrier metal 4, and metal wire 5.

Now, a method for forming the interlayer insulation film 3 will be specifically described. An outline of the above process is given below (steps 1 to 4).

Step 1: A vanish is applied on a semiconductor substrate by using a spin coating technique.

Step 2: A heat treatment 80° C., one minute is applied to the substrate.

Step 3: A heat treatment 200° C., one minute is applied to the substrate.

Step 4: An electron beam is irradiated on the semiconductor substrate 1 while the semiconductor substrate 1 is heated in a reduced pressure nitrogen atmosphere, and the interlayer insulation film 3 is formed.

The above described process will be described in detail. First, a vanish obtained by dissolving polymethyl siloxane as a precursor of film material in solvent is applied with a spin coating technique using a coater, and a coat film is formed (step 1). For instance, the solvent is a PGPE (propylene glycol monopropyl ether).

Next, the semiconductor substrate is placed on a hot plate placed in a chamber that is the same as a reactor chamber for carrying out the electron beam irradiation treatment, and is held at 80° C. This state is held for one minute, whereby heat treatment is applied to the above coat film at 80° C. for one minute (step 2).

Next, while the semiconductor substrate 1 is placed on the above hot plate, a temperature of the above hot plate is held at 200° C. This state is held for one minute, wherein heat treatment is applied to the above coat film at 200° C. for about one minute in a chamber that is the same as a reactor chamber for carrying out the electron beam irradiation treatment (step 3).

In accordance with the step 2 or step 3, the solvent contained in the coat film formed at the step 1 is removed, and the coat film is fixed on the semiconductor substrate 1.

Then, while the nitrogen gas is introduced into the reaction chamber about 20 slm, the semiconductor substrate 1 is placed on the hot plate held at 400° C. in the reduced pressure nitrogen atmosphere, the above coat film is irradiated with the electron beam, and the interlayer insulation film 3 is formed (step 4).

In the present embodiment, during the electron beam irradiation at step 4, the pressure in the reactor chamber is changed to 40 Torr and 60 Torr. That is, the electron beam irradiation is carried out by setting the pressure in the reactor chamber to 40 Torr and setting the quantity of incident electrons per unit time (irradiation quantity) to about 5 $\mu C/cm^2 \cdot sec$ for about 90 seconds from the start of the electron beam irradiation. Then, the electron beam irradiation is carried out by setting the pressure in the reactor chamber to 60 Torr and setting the irradiation quantity to about 4 $\mu C/cm^2 \cdot sec$ for about 30 seconds until the end of the subsequent electron beam irradiation. The energy of the electron beam is set in a range of 1–15 keV. The total quantity of electrons incident to the substrate(total irradiation quantity) is 500 $\mu C/cm^2$. The total irradiation quantity is not limited to the above value, i.e. the total irradiation quantity is set that polymethyl siloxane film is not modified.

Figure 2A:
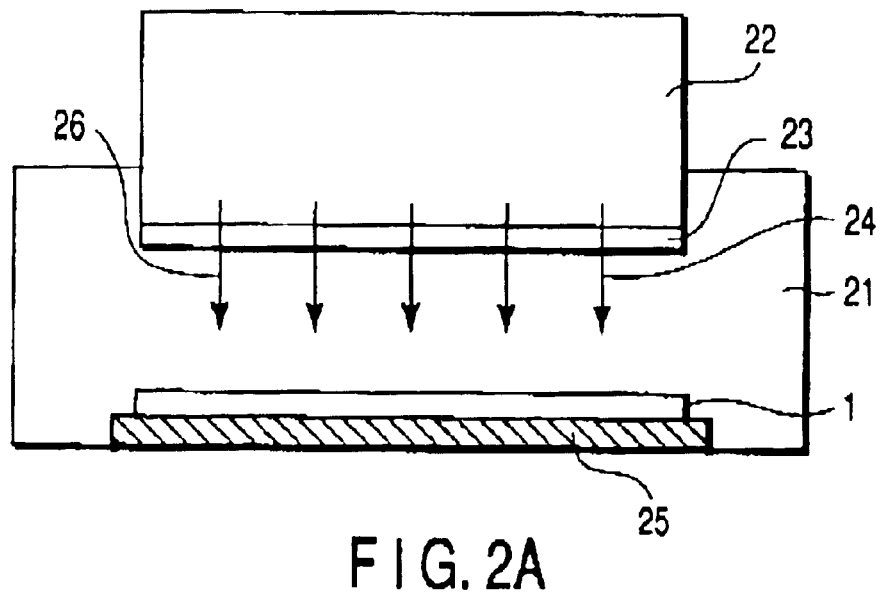
FIGS. 2A and 2B show schematic illustrations of an electron beam irradiation apparatus used in embodiments of the present invention.
Figure 2B:
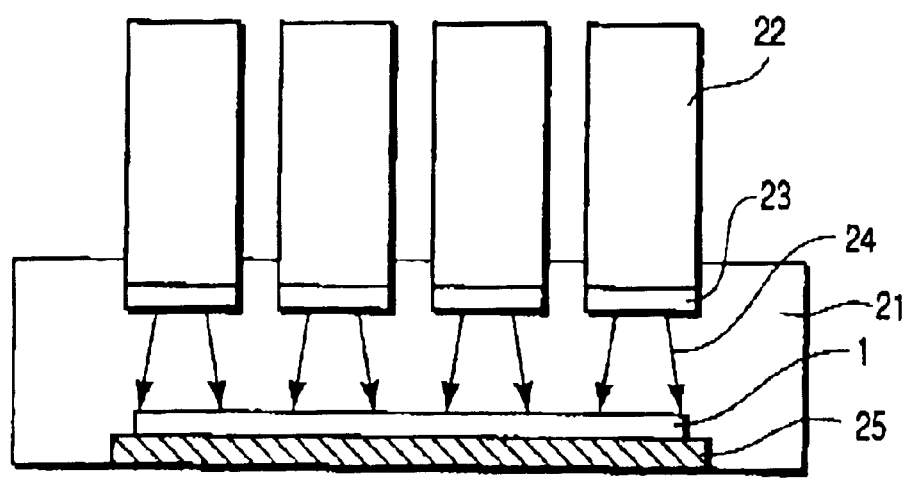

Now, an electron beam irradiation apparatus used in the present embodiment and the following embodiments will be described with reference to FIGS. 2A and 2B.

At least one electron beam generating section 22 is provided at the upper part of a reactor chamber 21 where the electron beam irradiation is carried, the electron beam generating section 22 is isolated from the reactor chamber 21 by a bulkhead 23; and the electron beam 24 is introduced in the reactor chamber 21 through the bulkhead 23. At the lower part of the reactor chamber 21, a hot plate 25 is provided at a position opposite to the lower part of the electron beam generating section 22. FIG. 2A shows an apparatus when one electron beam generating section 22 is provided, and FIG. 2B shows an apparatus when a plurality of electron beam generating sections 22 are provided.

A semiconductor substrate 1 having the coat film formed thereon is placed on the hot plate 25, and the semiconductor substrate 1 is irradiated with the electron beam 24 under a desired condition. Here, the hot plate 25 is connected to a control unit (not shown), and the hot plate 25 is maintained at a desired temperature by the control unit. By using the hot plate 25, the semiconductor substrate 1 placed thereon is held at a nearly uniform temperature, and the uniformity of processing is ensured.

On the other hand, a commercially available electronic irradiation apparatus includes an ElectronCure (TM) device available from Electron vision inc., the United States. A plasma is used for an electron beam source of the above apparatus. The electrons in the plasma is drawn to a substrate reactor chamber via a mesh and the electron beam generating section and reactor chamber are always in the same atmosphere.

Therefore, if a gas containing an organic component is generated from a film to be treated by means of the electron beam irradiation treatment, the pressure in an electric discharge region rapidly changes. If the pressure in the electric discharge region rapidly changes, the electron beam source becomes unstable. As a result, uniform irradiation of electron beams becomes impossible. Therefore, when the above apparatus is used, there occurs a problem that a dispersion occurs with characteristics of film after burned, permittivity or mechanical strength, for example.

In contrast, in the electron beam irradiation apparatus used in the present embodiment, a bulkhead 23 is provided between the electron beam generating section 22 and the object to be irradiated (semiconductor substrate 1 having a coat film formed thereon) so that the object is irradiated with the electron beam 24 via the bulkhead 23. Therefore, an effect of gas generated from the object on the electron beam generating section 22 is restrained by the bulkhead 23. As a result, the object can be irradiated with uniform electron beam 24, and the dispersion can be eliminated from characteristics of the film after burned.

The interlayer insulation film formed by the above method is formed by bridge due to dehydrate condensation of the precursor included in the raw material. Film contraction occurs during such bridge, and the residual stress occurs with the film after film forming due to such film contraction.

In the case where a coat film is cured by only heat treatment such as in a conventional manner, the contraction of the coat film occurs while the semiconductor substrate is thermally expanded. Therefore, when the coat film is cooled to room temperature, the contraction of the semiconductor substrate applies to the coat film during a temperature fall, and the residual stress is further increased. The above described residual stress is one of the factors of a crack which occurs during film forming or after film forming. Therefore, in order to reduce the residual stress, it is desired that the heat treatment in the step 4 be carried out by setting the substrate temperature to a temperature not more than 500° C.

However, if the temperature was too low, bridge reaction such as dehydration reaction is not accelerated, and a desired mechanical strength is not be obtained. According to research made by the inventors, it is found that at least a heating temperature of 200° C. or more is required to effectively accelerate reaction such as dehydration reaction. From the foregoing, the heating temperature is set to 400° C. in the present embodiment.

Further, when the step 4 is executed, the pressure in the reactor chamber is set to not more than 400 Torr so as to prevent the surface of the coat film from being oxidized by oxygen in atmosphere, and the oxygen concentration is restrained to not higher than 100 ppm. In the present embodiment, the electron beam treatment is carried out in the nitrogen atmosphere of 40 Torr or 60 Torr.

In addition, in order to maintain the uniformity of electron beam irradiation under the above condition, a hot plate 25 is placed at a position of 75 mm from the lower end of the electron beam generating section 22, and the electron beam irradiation is carried out in the present embodiment.

Now, characteristics of the insulation film (interlayer insulation film 3) formed in accordance with the method of the present embodiment will be described here.

Table 1 shows relative dielectric constant and crack resistance film thickness in insulation films (polymethylsiloxane film) formed by process of the present embodiment, a process A (only heat treatment), a process B (heat treatment and electron beam irradiation, the pressure in the reactor container: 40 Torr), and method C (heat treatment and electron beam irradiation, the pressure in the reactor container: 60 Torr). In the process B, the irradiation quantity is set to about 5 $\mu C/cm^2 \cdot sec$, and the electron beam irradiation time is set to 120 seconds. In a process C, the irradiation quantity is set to about 4 $\mu C/cm^2 \cdot sec$, and the electron beam irradiation time is set to 120 seconds.

The relative dielectric constant is measured by using a mercury probe technique. The crack resistance film thickness film thickness is a thickness when cracking is observed visually or with an optical microscope.

TABLE 1

|  | Embodiment | A | B | C |
|---|---|---|---|---|
| Relative dielectric constant | 3.03 | 3.01 | 3.03 | 3.20 |
| Crack resistance film thickness ($\mu$m) | 1.8 | 1.2 | 1.3 | 1.9 |

The insulation film formed by the process of the present embodiment has a relative dielectric constant of about 3.0 that is nearly identical to that formed by the process A. With respect to the crack resistance film thickness, the insulation film formed by the process of the present embodiment is improved by 1.5 times as compared with that formed by the process A.

The insulation film formed by the process B has a relative dielectric constant of about 3.0 that is nearly identical to that formed by the process A. With respect to the crack resistance film thickness, the insulation film formed by the process B is found to have been improved by 1.1 times as compared with that formed by the process A.

The insulation film formed by the process C has a relative dielectric constant that is greater than that formed by the process A. With respect to the crack resistance film thickness, the insulation film formed by the process C is found to have been improved by about 1.6 times as compared with that formed by the process A.

If an attempt is made to obtain an insulation film having a film quality equivalent to that of the present embodiment by the process B or C, it is required to increase the irradiation time or to increase the irradiation quantity. In this case, it is found that a treatment time is increased, productivity is lowered, the insulation film with low relative dielectric constant is not obtained by an excessive electron beam irradiation, or the bridge reaction of the precursor is not well achieved, and an insulation film having desired film quantity cannot be obtained.

In the present embodiment, the insulation film having low relative dielectric constant and excellent crack resistance properties is obtained by well combining the processes B and C with each other, i.e., by combining the heat treatment and the electron beam irradiation treatment, and by changing the pressure to two stages.

Figure 3:
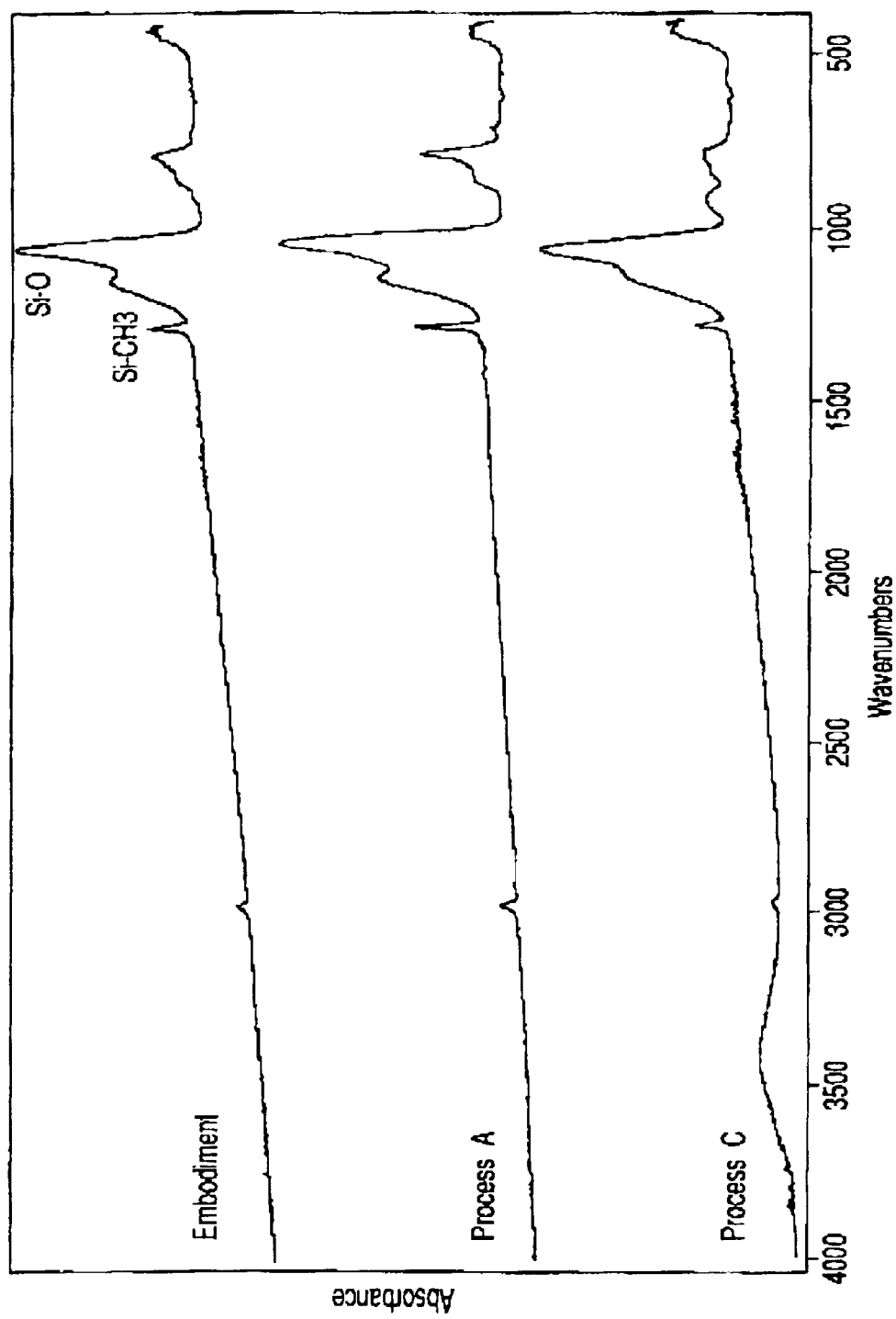
FIG. 3 shows spectrum intensities obtained by a Fourier transform infrared-ray spectroscopy (FT-IR,) of an insulation films formed by a process of the first embodiment and process A–C.

FIG. 3 shows spectrum intensities obtained by a Fourier transform infrared-ray spectroscopy (FT-IR) of the insulation films (polymethyl siloxane film) formed by the respective processes. In FIG. 3, spectrum intensities of the three insulation film is arranged vertically for ease of comparison. A FT-IR spectrum of the insulation film formed by the process B is nearly identical that of the insulation film formed by the process C.

It is evident from FIG. 3 that the insulation film formed by the process of the present embodiment and the process C is small in peak intensity of Si—$CH_3$ bonding in the vicinity of a wave number of 1300 $cm^{-1}$ as compared with the insulation film formed by the process A. This indicates that bonding between a $CH_3$ group and a primary chain in a molecule has been cut by the electron beam irradiation in the case of the present embodiment and the process C.

In addition, it has been evident that, in the insulation film formed by the process A, a separation of Si—O bonding peak intensity is significant in a vicinity of wave numbers of 1050 $cm^{-1}$ and 1150 $cm^{-1}$. This indicates that a straight chain shaped Si—O bonding exists in the insulation film. In contrast, in the insulation films formed by the process of present embodiment and the process C, the separation of Si—O bonding is gentle. This indicates that the straight chain shaped bonding has been broken, and complex Si—O bonding has been formed.

Further, in the insulation film formed by process C, there appears a large peak caused by $H_2O$ bonding in the vicinity of a wave number of 3500 $cm^{-1}$ and Si—OH bonding in a vicinity of a wave number of 980 $cm^{-1}$, but in the insulation films formed by the process of present embodiment and process A, almost no peak appears in the vicinity of the above wave number.

From these facts, in the case process C, it is considered that a sufficient dehydration reaction is not carried out, and a number of Si—OH bonding and $H_2O$ remains in the insulation film.

Namely, in the process C, the cutting of $CH_3$ in a vicinity of a surface of the insulation film is accelerated by the electron beam irradiation, and sufficient dehydrate reaction occurred, but sufficient dehydrate reaction did not occur in the entire insulation film, and this is considered as a reason why the insulation film formed by the process C does not have a low relative dielectric constant. On the other hand, a strong network is formed in the vicinity of the surface, and this is considered as a reason why the mechanical strength of the insulation film formed by the process C is improved.

On the other hand, in the insulation film formed by the process of the present embodiment, there appears neither a peak caused by $H_2O$ bonding in the vicinity of the wavelength of 3500 $cm^{-1}$ nor a peak caused by Si—OH bonding in the vicinity of the wavelength of 980 $cm^{-1}$. Namely, heat treatment is carried out at the same time as the electron beam irradiation, and changing the pressure, whereby bonding between the $CH_3$ group and the primary chain in a molecule is cut, and a dangling bond is formed. In addition, dehydration reaction effectively occurs due to heat treatment, whereby the dangling bond is coupled with another molecule or group without being coupled with the OH group. This is considered as a reason why the insulation film formed by the process of the present embodiment has low relative dielectric constant and sufficient crack resistance property by the formation of the rigid network.

Now, a change in film structure of each of the insulation films formed by the process of the present embodiment and process A–C is discussed here.

The inventors, analyzed by FT-IR each of the insulation films formed by the process of the present embodiment, process A, and process C, and investigated a ratio of a respective one of the spectrum intensity area of Si—$CH_3$ bonding to the spectrum intensity area of Si—O and the sum of the spectrum intensities area of $H_2$ and Si—OH when the spectrum intensity area for Si—O bonding is defined as 1. The result is shown in Table 2.

TABLE 2

|  | Si—O | Si—$CH_3$ | $H_2O$ + Si—OH |
|---|---|---|---|
| Embodiment | 1 | 0.03 | 0.00 |
| Process A | 1 | 0.04 | 0.00 |
| Process C | 1 | 0.02 | 0.52 |

An semiconductor device including an insulation film formed by a process according to an aspect of the present invention is generally described as bellow. That is a semiconductor device according to an aspect of the present invention comprises a substrate; and an organic silicon oxide film provided on the substrate, wherein, when the organic silicon oxide film is analyzed by using a Fourier transform infrared-ray spectroscopy, a ratio of a spectrum intensity area for Si—$CH_3$ bonding to a spectrum intensity area for Si—O bonding is from 0.01 to 0.03, and a ratio of a spectrum intensity area for $H_2O$ and Si—OH bonding to a spectrum intensity area for Si—O bonding is not higher than 0.001, respectively.

More specifically, relative dielectric constant of the insulation film is not higher than 3.5, and a crack resistance film thickness of the insulation film is not less than 1.5 microns. The organic silicon oxide film is a polymethylsiloxane film. And further comprises a wire whose main material is Cu and which is embedded on a surface of the insulation film.

The electron beam irradiation dose or the like is increased in order to further accelerate bridge reaction, the spectrum intensity of Si—$CH_3$ bonding further decreases, and a mere silicon oxide film is produced. Thus, if bridge reaction is further accelerated, even if crack resistance property is sufficient, there is a possibility that the insulation film with a low relative dielectric constant is not obtained. According to experiments made by the inventors, it is found that the spectrum intensity area ratio of Si—$CH_3$ bonding must be at least 0.01.

In this way, as in the present embodiment, the process B and the process C are well combined with each other, whereby molecule chain cutting and bridge, and dehydrate condensation are effectively carried out. As a result, there can be provided an insulation film with high mechanical strength and low relative dielectric constant.

According to researches made by the inventors, with respect to the sum of number of scratches and cracks caused by CMP process, the insulation film formed by the process of the present embodiment is reduced by $1/10$ times as compared with that formed by the process A.

In addition, with respect to thickness of a damage layer formed by dry etching and dry ashing as well, the insulation film formed by the process of the present embodiment is found to have been reduced by about 30% as compared with that formed by the process A.

In the present embodiment, the pressure and the irradiation quantity are changed, the insulation film with high mechanical strength and low relative dielectric constant can be obtained by changing one of the pressure and the irradiation quantity.

Further the insulation film with high mechanical strength and low relative dielectric constant can be obtained by changing a parameter other than the pressure and irradiation quantity. The parameter other than the pressure and irradiation quantity is one of temperature of the semiconductor substrate 1, type of gas having the semiconductor substrate 1 exposed thereto, flow rate of the gas introduced into the reactor chamber, and position of the semiconductor substrate 1. For example, in the step 4, the similar effect can be obtained by changing the temperature from 400° C. to 200° C., changing the gas type from nitrogen to argon, changing the flow rate of the gas from 25 slm to 3 slm, or changing the position of the semiconductor substrate 1 from 50 nm to 120 nm.

However, in this case, the insulation film may not be obtained by the degrees of demand of mechanical strength and relative dielectric constant. Therefore, in generally, it is preferable to change a plurality of the parameters. The similar effects can be obtained by changing a plurality of the parameters other than the pressure and irradiation quantity, or one of the pressure and irradiation quantity and at least one of parameter other than the pressure and irradiation quantity.

Namely, the effects as shown in the present embodiment can be obtained by changing at least one of the pressure in the reactor container, the temperature of the semiconductor substrate 1, the type of gas having the semiconductor substrate 1 exposed thereto, the flow rate of the gas introduced into the reactor container, the position of the semiconductor substrate 1, and the irradiation quantity.

Further, in the step 4, the pressure and the irradiation quantity are changed in the direction of increasing and decreasing respectively, however, even if one of the parameters is changed in an opposite direction, there is a case that the effects of the present embodiment can not be obtained. In generally, the direction (increasing, decreasing) of change of the parameters is important to obtaining a desired effect by changing a plurality of parameters. In generally, the direction differ by the selected parameters, or the degrees of demand of mechanical strength or relative dielectric constant. Therefore the direction of change of the parameters are appropriately selected.

The above described parameters can be specifically changed within the following range. The pressure can be changed in a range from higher than 0 Torr to not more than 40 Torr; the temperature can be changed in a range from not less than 200° C. to not more than 500° C.; the type of gas can be changed among a nitrogen gas, a rare gas, a reduction gas (for example $H_2$) and a mixture at least two gases of the nitrogen gas, rare gas and reduction gas whose oxygen concentration is not higher than 100 ppm; the flow rate of gas having the substrate exposed thereto, the gas can be changed in a range of from higher than 0 slm to not more than 25 slm; the position of the semiconductor substrate 1 can be changed in a range from not less than 50 mm to not more than 120 mm in distance from a lower end of the electron beam generating section; and the irradiation quantity can be changed in a range from not less than 4 $\mu C/cm^2$·sec to not more than 10 $\mu C/Cm^2$·sec.

The heat treatment process in the steps 2 and 3 may be carried out in a reactor container that is different from that in the step 4. Of course, this process may be carried out in the same reactor container as that in the step 4.

In addition, the process of the present embodiment is applied to form an interlayer insulation film at the bottom layer in a multi-layered wiring structure, the similar process is applicable to form an interlayer insulation film in each layer.

(Second Embodiment)

Now, a method for manufacturing a semiconductor device according to a second embodiment of the present invention will be described here.

The present embodiment is different from the first embodiment in view of a process for forming the interlayer insulation film 3. An outline of the process is given below (steps 1 to 5).

Step 1: A vanish is applied on a semiconductor substrate by using a spin coating technique.

Step 2: A heat treatment 80° C., one minute is applied to the substrate.

Step 3: A heat treatment 200° C., one minute is applied to the substrate.

Step 4: An electron beam is irradiated on the semiconductor substrate 1 while the semiconductor substrate 1 is heated in a reduced pressure nitrogen atmosphere, and the interlayer insulation film 3 is formed.

Step 5: A heat treatment 400° C., about two minutes is applied to the semiconductor substrate 1.

The above process will be described in detail. First, as in the first embodiment, the steps 1 to 3 are executed.

Then, while the nitrogen gas is introduced into the reaction chamber about 20 slm, the semiconductor substrate 1 is placed on the hot plate held at 400° C. in the reduced pressure nitrogen atmosphere, a coat film is irradiated with the electron beam, and the interlayer insulation film 3 (polymethyl siloxane film) is formed (step 4).

In the present embodiment, during the electron beam irradiation at step 4, the pressure in the reactor chamber is changed to 10 Torr and 60 Torr. That is, the electron beam irradiation is carried out by setting the pressure in the reactor chamber to 10 Torr and setting the irradiation quantity to about 5 $\mu C/cm^2 \cdot sec$ for about 180 seconds from the start of electron beam irradiation. Then, the electron beam irradiation is carried out by setting the pressure in the reactor chamber to 60 Torr and setting the irradiation quantity to about 4 $\mu C/cm^2 \cdot sec$ for about 30 seconds until the end of the subsequent electron beam irradiation.

In addition, in order to maintain the uniformity of electron beam irradiation under the above condition, a hot plate is placed at a position of 75 mm from the lower end of the electron beam generating section, and the electron beam irradiation is carried out in the present embodiment.

Further, the semiconductor substrate 1 is placed on a hot plate maintained at 400° C. in the same reactor container used it the step 4, heat treatment is carried out for about 2 minutes, and the interlayer insulation film 3 is formed (step 5).

In the step S5, for about 30 seconds from the start of treatment, the hot plate is placed at a position 75 mm from the lower end of the electron beam generating section, and the heat treatment is carried out. For about the subsequent 1.5 minutes, the hot plate is placed at a position 120 mm from at the lower end of the electron beam generating section, and treatment is carried out.

Further, it is desirable to set the substrate temperature to 200° C. or more, and not more than 500° C. in the heat treatment of the step 4 by virtue of a reason similar to that stated in the step 4 of the first embodiment.

In addition, the heat treatment temperature in the step 5 is effective when the temperature is equal to or higher than that of the step 4. Further, the treatment time is effective when the time is equal to or longer than that at the step 4.

As the reasons similar to those at the step 4 of the first embodiment, it is desirable that the steps 4 and 5 are executed in reduced pressure atmosphere in which an oxygen concentration is reduced to 100 ppm or less.

With respect to characteristics of the polymethylsiloxane film formed by the process of the present embodiment, advantageous effect similar to that shown in the first embodiment is obtained.

Further, by the heat treatment process at the step 5, a damage caused in a gate insulation film of a semiconductor element can be removed by the electron beam irradiation, and characteristics such as leak current or threshold voltage of a semiconductor device is improved.

In the step 5, even when the type of gas having a semiconductor substrate 1 exposed thereto is $N_2$, Ar, or forming gas (a mixture gas of $N_2$ and $H_2$), the above described advantageous effect is observed. In the case of forming gas, there is achieved an effect which is more advantageous by about 1.5 times as compared with $N_2$ or Ar.

In the step 5 (pre-step) of the present embodiment, the position (gap) semiconductor is changed, at least one other parameters can be changed. The parameters are pressure in the reactor chamber, temperature of the semiconductor substrate 1, type of gas having the semiconductor substrate 1 exposed thereto, flow rate of the gas introduced into the reactor chamber, and position of the semiconductor substrate 1. Further at least two parameters including the position of the semiconductor substrate 1 can be changed.

In terms of the direction of change of the parameters, the direction of increasing is applicable to the temperature, the direction of increasing and decreasing are applicable to the pressure and the flow rate and the gap. The realistic change of the type of gas is from argon or nitrogen to mixture of these. These parameters at the step 5 can be specifically changed in the same range as those at the step 4. The heat treatment of the pre-step is carried out in the reactor container for carrying out the electron beam irradiation process in the same way as that at the post-step. The heat treatment of the pre-step is sequentially carried out together with the electron beam irradiation process.

In the present embodiment, the parameter is changed in the heat treatment of the post-step, it can be changed in a heat treatment of the pre-step. The heat treatment of the pre-step means the heat treatment of the step 3. In this case, the step 2 can be merged with the step 3, and the step 3 can be omitted. In this case the direction of change of the temperature, the pressure, the gas flow rate, and the gap are same those of the pre-step. The change of the type of gas is from nitrogen to argon, or from argon to nitrogen. Further, the parameter can be changed in the heat treatment of the pre-step and the post-step.

(Third Embodiment)

Now, a method for manufacturing a semiconductor device according to a third embodiment of the present invention will be described here. The present embodiment is different from the first embodiment in view of the method for forming an interlayer insulation film 3. An outline of the above process is given below (steps 1 and 2).

Step 1: A vanish is applied on a semiconductor substrate 1 by using a spin coating technique.

Step 2: An electron beam is irradiated on the semiconductor substrate 1 while the semiconductor substrate 1 is heated in a reduced pressure nitrogen atmosphere, and the interlayer insulation film 3 is formed.

The above process will be described in more detail. First, as in the first embodiment, the step 1 is executed, and a coat film is formed.

Next, the above semiconductor substrate is placed on a hot plate held at 400° C. in the reduced pressure nitrogen atmosphere, a coat film is irradiated with electron beams, and the interlayer insulation film 3 is formed (step 2). The above electron beam irradiation is carried out in a condition of 6 keV in the electron beam energy and 50 $\mu$C/cm$^2$ in total irradiation quantity.

Here, by virtue of a reason similar to that stated in the step 4 of the first embodiment, it is desirable that the step 2 be in reduced pressure atmosphere in which the oxygen concentration is restrained to 100 ppm or less.

Further, by virtue of a reason similar to that stated in the step 4 of the first embodiment, it is desirable that the substrate temperature be set to 200° C. or more and not more than 500° C. in the heating process of the step 2 by virtue of a reason similar to that stated in the step 4 of the first embodiment.

In the polymethyl siloxane film formed by the method of the present embodiment, advantageous effect similar to that according to the first embodiment is attained. In addition, the present embodiment is more excellent than the first embodiment in view of productivity because the number of steps is smaller than that of the first embodiment by two. Further at least one parameter can be changed as the first embodiment and similar effects can be attained. For instance the temperature can be changed from 200° C. to 400° C.

(Fourth Embodiment)

Now, a method for manufacturing a semiconductor device according to a fourth embodiment of the present embodiment will be described here. The present embodiment is different from the first embodiment in view of the method for forming an interlayer insulation film 3. An outline of the above process is given below (steps 1 to 3).

Step 1: A vanish is applied on a semiconductor substrate 1 by using a spin coating technique.

Step 2: An electron beam is irradiated on the semiconductor substrate 1 while the semiconductor substrate 1 is heated, and the interlayer insulation film 3 is formed.

Step 3: A heat treatment 400° C., two minutes is applied to the substrates

The above process will be described in more detail. First, as in the first embodiment, the step 1 is executed, and a coat film is formed (step 1).

Next, the above semiconductor substrate is placed on a hot plate held at 200° C. in a nitrogen atmosphere under air pressure, the above coat film is irradiated with the electron beam, and an interlayer insulation film is formed (step 2). The above electron beam irradiation is carried out under a condition of 6 keV in the electron beam energy and 500 $\mu$C/cm$^2$ in irradiation quantity.

By a reason similar to that stated in the step 4 of the first embodiment, it is desirable that the substrate temperature be 200° C. or more and not more than 500° C. during heating in the step 2. By a reason similar to that stated in the step 4 of the first embodiment, it is desirable that the step 2 is carried out in an atmosphere and the oxygen concentration is restrained to not higher than 100 ppm.

In addition, according to experiment made by the inventors, it is found that the temperature of heat treatment in the step 3 is effective when the temperature is equal to or greater than that in step 2. In addition, it is found that the time of heat treatment in the step 3 is effective when the time is equal to or longer than that in the step 2.

By a reason similar to that stated in the step 4 of the first embodiment, it is desirable that the steps 2 and 3 be executed in non-reduced (normal) pressure atmosphere or in reduced pressure atmosphere in which the oxygen concentration is restrained to 100 ppm or less.

As characteristics of the polymethyl siloxane film formed by the method of the present embodiment, advantageous effect similar to that according to the first embodiment is attained.

Further, as in the second embodiment, the damage of an element or the like caused by the electron beam irradiation can be recovered by heat treatment of the step 3, whereby, for example, characteristics such as a leak current or a threshold voltage of a MOS type element can be improved. In addition, the present embodiment is more excellent than the second embodiment in view of productivity because the number of steps is smaller than that of the second embodiment by two. Further at least one parameter can be changed as the first embodiment and similar effects can be attained. For instance the temperature can be changed from 200° C. to 400° C.

(Fifth Embodiment)

Figure 4A:
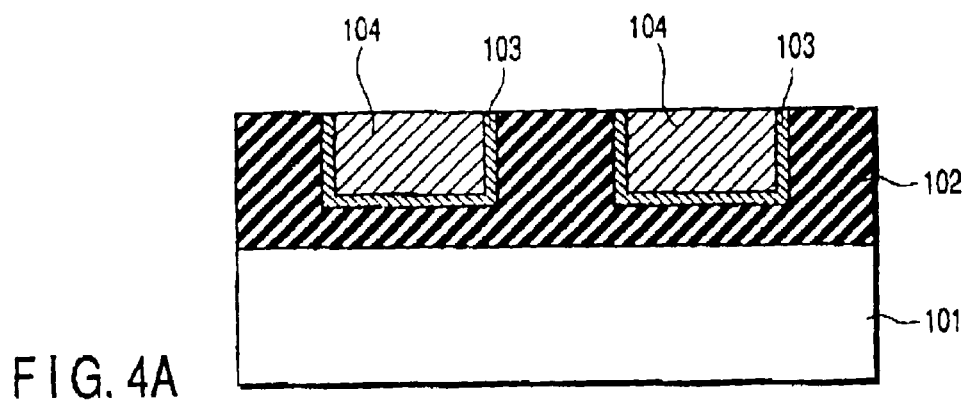
FIGS. 4A–4C show cross sectional views of a manufacturing process of a semiconductor device according to a five embodiment of the present invention.
Figure 4B:
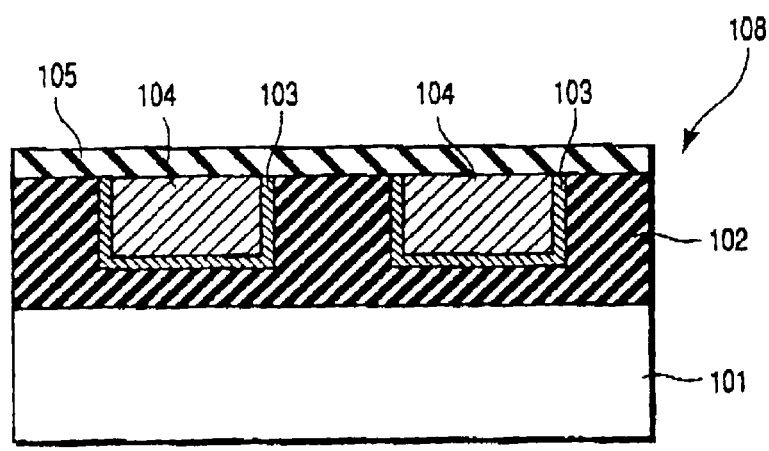
Figure 4C:
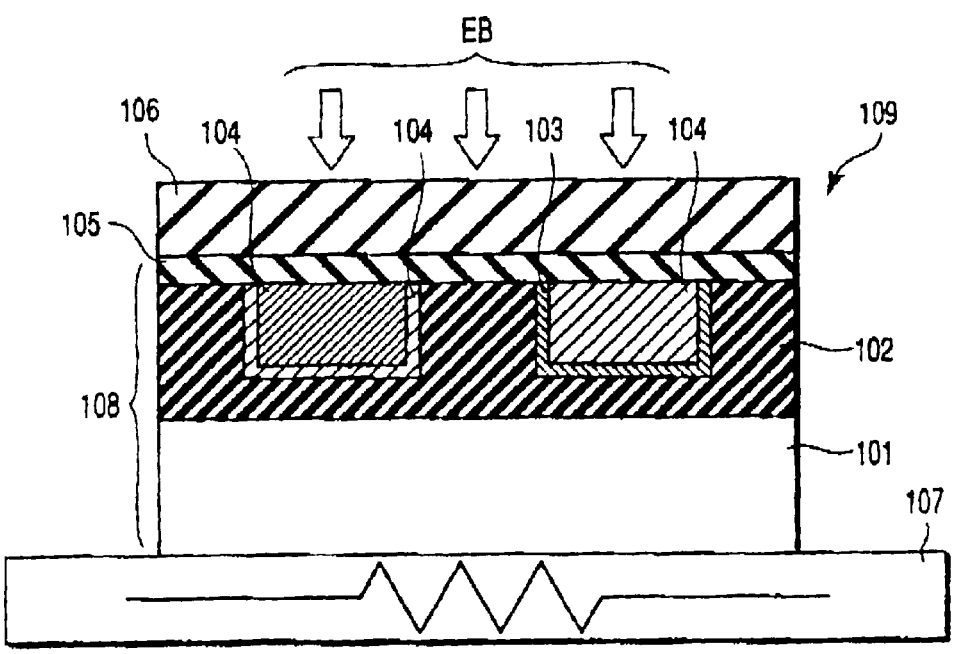

FIGS. 4A to 4C are sectional view showing the steps of manufacturing a semiconductor device according to a fifth embodiment of the present invention.

First, as shown in FIG. 4A, a base insulation film 102 is formed on a surface of a semiconductor substrate 101. Here, a TEOS film is used as the base insulation film 102. Substantially, a wiring groove of its desired size and shape is formed at a predetermined part on the surface side of the base insulation film 102, and then, a barrier metal 103 and Cu wire 104 consisting of Cu as a main material are formed inside of the wiring groove in accordance with a conventional CMP process. In addition, the surfaces of the base insulation film 102, barrier metal 103, and Cu wire 104 are flattened.

Next, as shown in FIG. 4B, a silicon nitride film 105 is formed as a barrier insulation film on the surfaces of the flattened base insulation film 102, barrier metal 103, and Cu wire 104.

Next, as shown in FIG. 4C, an interlayer insulation film 106 with its low dielectric rate is provided on a silicon nitride film 105. Here, a polymethyl siloxane film is used as the interlayer insulation film 106 with its low dielectric rate.

Hereinafter, the steps of forming the above polymethyl siloxane film will be described in detail by dividing the steps into steps 1 to 4.

In the following description, as shown in FIG. 4B, if up to a SiN layer 105 is formed, it is referred to as a first semiconductor substrate 108. The steps 1 to 4 described below are sequentially executed on the first layer semiconductor substrate 108, whereby a desired semiconductor device 108 can be obtained.

Step 1

A liquid-like raw material called a vanish (not shown) obtained by dissolving a film material or a polymethyl siloxane for a precursor of the film material is supplied on a surface of the silicon nitride film 105.

As a method for supplying the vanish, there is employed a coating technique capable of supplying the vanish uniformly with substantially uniform thickness so that a good quality polymethyl siloxane film is formed in the present embodiment. In this vanish coating work, specifically, a coater (not shown), for example, is used as a coating device, whereby a vanish is applied on the surface of the silicon nitride film 105 by using a spin coating technique that is one kind of the coating methods.

Step 2

A first layer semiconductor substrate 108, as shown in FIG. 4C, is placed on a hot plate 107 (heating device) that as a temperature control unit at a posture at which a silicon nitride film 5 having its vanish applied thereto is oriented upwardly. Then, the temperature of the hot plate 107 is controlled so that the vanish temperature is held at about 80° C.; the vanish is heated together with the first layer semiconductor substrate 108, and this state is held for about one minute. In this manner, a first heating process is applied to the vanish.

Step 3

While the semiconductor substrate 108 is placed on the hot plate 107, the temperature of the hot plate 107 is controlled so that the vanish temperature is held at about 200° C. Then, the vanish is heated together with the first layer semiconductor substrate 108, and this state is held at about 1 minute. In this manner, a second heating process is applied to the vanish.

The solvent contained in the vanish is removed by evaporation in accordance with the heating process of the steps 2 and 3 each, and the vanish (coat film) is fixed (deposited) on the silicon nitride film 105.

According to experiments made by the inventors, as in the steps 2 and 3, a heating process for increasing the vanish temperature in a stepwise manner is employed, thereby clearly making it possible to evaporate a component (for example, solvent) other than polymethyl siloxane that is one of the essential components of the polymethyl siloxane film in the vanish efficiently and substantially completely and to effectively fix the coat film.

Step 4

While the first semiconductor substrate 108 is placed on the hot plate 107, the substrate is disposed in reduced pressure atmosphere in which up to about 10 Torr is reduced pressure so that the vanish and the polymethyl siloxane film formed based on this vanish is oxidized. In addition, the atmosphere in which the first semiconductor substrate 108 is disposed is filled with gas that essentially consists of $H_2$ gas having reduction properties. The above $H_2$ gas cleans the surface of the Cu wire 104, and restrains oxidization of the surface when an electron beam irradiation work described later is carried out.

In this state, the temperature of the hot plate 107 is controlled so that the vanish temperature is held at about 400° C., and a vanish is heated together with the first semiconductor substrate 108. As indicated by an arrow shown in FIG. 4C, the electron beam of about 10 keV in irradiation (acceleration) energy and the irradiation quantity of about 500 $\mu C/cm^2$ is irradiated by the electron beam irradiation device to the vanish.

At this time, a heating state and the electron beam irradiation state are held at about 5 minutes. In this manner, a polymethyl siloxane film is formed on the surface of the silicon nitride film 105, in other words, on the first semiconductor substrate 108.

As has been described above, while heating process is applied to a vanish only in the step 4 that is a final step of the step 2 to 4, and the vanish is irradiated with the electron beam.

The reason is to prevent from forming an interlayer insulation film with its low dielectric rate having undesirable characteristics caused by a modification of components other than polymethyl siloxane such as solvent contained in a vanish. The modification occurs by irradiating the vanish that is not fixed on the silicon nitride film 105 with the electron beam.

That is, this is because a polymethyl siloxane film is obtained as an interlayer insulation film 106 with its low dielectric rate having desired characteristics.

According to experiments carried out by the inventors, when a vanish is irradiated with the electron beam in the step 4, a heating process is carried out so that the vanish temperature is substantially constant within the range of 200° C. or more and not more than 500° C., preferably within the range of about 380° C. to 400° C., especially about 400° C., thereby clearly making it possible for the semiconductor device 109 to form a quality polymethyl siloxane film capable of having practically proper operating performance.

In addition, according to experiments made by the inventors, the irradiation dose of the electron beam irradiated to the vanish in the step 4 is set so that a substantially constant value is obtained at the total irradiation quantity about 500 $\mu C/cm^2$ or more, especially about 500 $\mu C/cm^2$ and the electron beam irradiation is carried out, thereby clearly making it possible to form a good quality polymethyl siloxane film such that the semiconductor device 109 can provide proper operating performance practically.

Similarly, according to experiments made by the inventors, in the step 4, acceleration energy is set so as to obtain a substantially constant value within the range of about 1 keV to 15 keV, preferable about 10 keV and a vanish is irradiated with the electron beam, thereby clearly making it possible to form a good quality polymethyl siloxane film in which the semiconductor device 109 can provide proper operating performance practically.

Furthermore according to experiments made by the inventors, when the electron beam is irradiated while a heating process is applied to a vanish in the step 4, the vanish is disposed in the reduced pressure atmosphere within a predetermined range in a gas having its predetermined reduction properties, thereby clearly making it possible to form a good quality polymethyl siloxane film in which the semiconductor device 109 can provide proper operating performance practically.

In particular, in the above $H_2$ gas, the vanish is disposed in the atmosphere when a pressure reducing value of about 0.1 Torr is set, thereby clearly making it possible to form a polymethyl siloxane film with its very good quality in which the semiconductor device 109 can provide very good operating performance practically.

After the steps up to the step 4 described above had been completed, when the obtained semiconductor device 109 is observed by using an optical microscope (not shown), the oxidization of the surface of the Cu wire 104 is not observed, In addition, during execution of the steps 1 to 4 and after these steps had been completed, the release of the base insulation film 102, barrier metal 103, Cu wire 104, silicon nitride film 105, and interlayer insulation film 106 (polymethyl siloxane film) is not observed.

In addition, when the resistance of the Cu wire 104 is measured, the measurements were equal before and after forming the polymethyl siloxane film as an interlayer insulation film 106.

As has been described above, according to the present embodiment, the steps 1 to 4 can be completed within a short time, i.e., only seven minutes, by using a heating work and the electron beam irradiation work altogether.

That is, according to the present embodiment, in the insulation film forming steps with only heating process using a hot plate according to the conventional technique, the film forming with solvent evaporation or precursor bridge reaction can be significantly reduced, which has required 30 minutes to one hour.

In addition, according to the present embodiment, the heating work and the electron beam irradiation work are used in combination, whereby the film burning temperature in the steps 1 to 4 can be restrained to 400° C. as described previously, for example, or alternatively, its upper limit can be restrained to not more than 500° C. even when the temperature is the highest.

That is, according to the present embodiment, in the insulation film forming steps with only the heating process using a hot plate according to a conventional technique, the film burning temperature in the final step of film burning can be reduced, which has required a very high film burning temperature of 500° C. or more.

Therefore, according to the present embodiment, the heating work and the electron beam irradiation work are used in combination, whereby the interlayer insulation film 106 can be formed without having a stimulus to the interlayer insulation film 106 or Cu wire 104 than necessary. In this manner, the grain growth of Cu in the Cu wire 104 in the film forming step is restrained, and the release on an interface between the Cu wire 104 and the silicon nitride film 105 is restrained.

In addition, the vanish is irradiated with the electron beam in an atmosphere of $H_2$ gas having the reduced pressure reduction properties, whereby the oxidization of the surface of the Cu wire in forming the interlayer insulation film 106 is restrained so that the resistance value of the Cu wire 4 can be maintained at a low level, which indicates a good state. A gas having its reduction properties other than $H_2$ gas can be used. In general, any gas can be used as long as the oxidization of wires (here, referred to as Cu wire 4) can be prevented, and the quality of film (here, referred to as interlayer insulation film 106) is not degraded.

Therefore, according to the present embodiment, electrical performance (quality) such as inter-wire capacity of the semiconductor device 109 can be improved, and the semiconductor device can be manufactured within a short time. As a result, the yields of the semiconductor 109 is improved, and the productivity of the semiconductor device 109 is improved.

In addition, according to the present embodiment, even if a polymethyl siloxane film that is an insulation film with its low dielectric rate is used as the interlayer insulation film 106, the film can be formed without degrading its performance and can be formed so as to be maintained in a good state within a short period of time. Thus, the relative dielectric constant of the semiconductor device 109 can be maintained at a low level, which indicates a good state.

That is, according to the present embodiment, the wiring capacity of the semiconductor device 109 is reduced so that a product between a wiring resistance and an inter-wire capacity can be reduced. In this manner, the operating speed of a semiconductor device 109 and those of various semiconductor device using the semiconductor device 109 can be improved more significantly.

In addition, when a semiconductor device having a plurality of wiring layers laminated thereon is desired, layers such as, barrier metal 103, Cu wire 104, silicon nitride film 105, or interlayer insulation film 106 may be formed repeatedly on the first semiconductor substrate 108 via base insulation film 102 in a manner similar to the previously described manner.

In this way, even if a plurality of wiring layers are formed there is almost no apprehension that electrical performance such as inter-wire capacity is degraded. Therefore, a semiconductor device with its high throughput and various semiconductor devices can be produced.

(Sixth Embodiment)

Figure 5A:
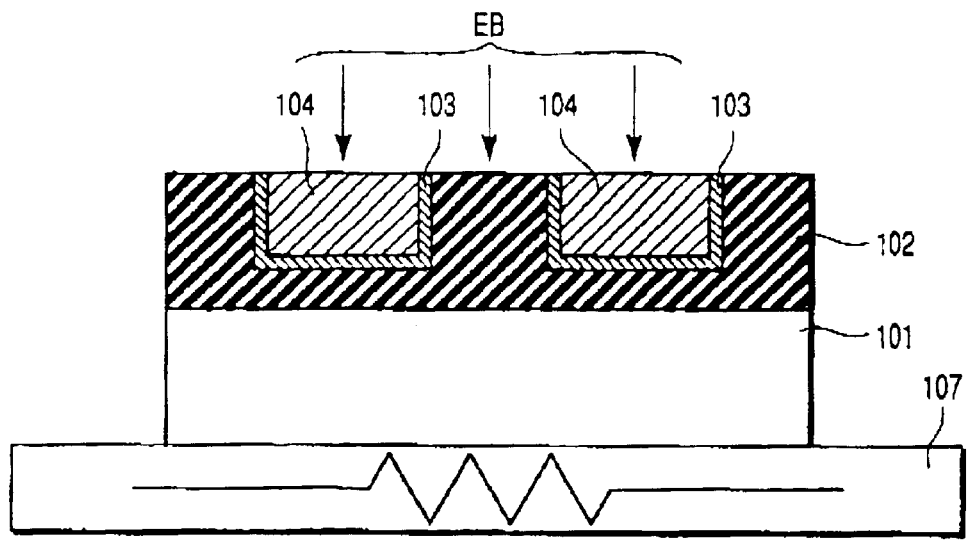
FIGS. 5A–5C show cross sectional views of a manufacturing process of a semiconductor device according to a six and seventh embodiments of the present invention.
Figure 5B:
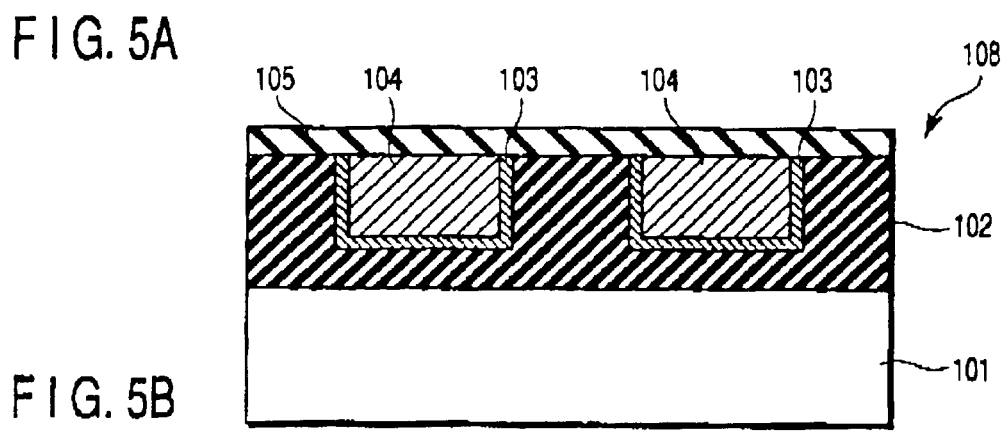
Figure 5C:
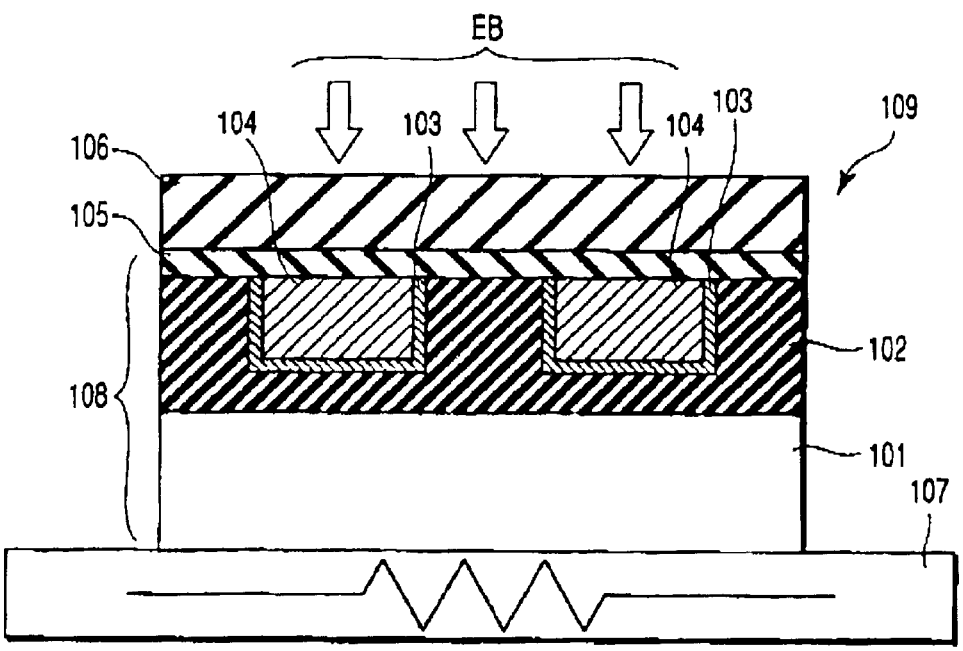

Next, the method of manufacturing a semiconductor device according to a sixth embodiment of the present invention is explained. FIGS. 5A–5C show cross sectional views of a manufacturing process of a semiconductor device according to the present embodiment. The present embodiment is difference from the fifth embodiment in that a polymethyl siloxane film is used as a base insulation film 102.

First, as shown in FIG. 5A, the base insulation film 102 is formed on a surface of a semiconductor substrate 101. Here, a polymethyl siloxane film is used as the base insulation film 102.

Hereinafter, the steps of forming this polymethyl siloxane film will be described by dividing them into the steps 1 to 4.

Step 1

A liquid-like raw material called a vanish (not shown) obtained by dissolving a film material or a polymethyl siloxane for a precursor of the film material is supplied on the surface of the silicon substrate 101. The way of supplying the vanish is the same as the step 1 of the fifth embodiment.

Step 2

The semiconductor substrate 1, as shown in FIG. 5A, is placed on a hot plate 107 at a posture at which a surface having the vanish applied thereon is oriented upwardly. Then, the temperature of the hot plate 107 is controlled so that the vanish temperature is held at about 80° C., the vanish is heated together with the semiconductor substrate 1, and this state is held for about one minute. In this manner, a first heating process is applied to the vanish.

Step 3

While the semiconductor substrate 101 is placed on the hot plate 107, the temperature of the hot plate 107 is controlled so that the vanish temperature is held at about 200° C. Then, the vanish is heated together with the semiconductor substrate 101, and this state is held at about one minute. In this manner, a second heating process is applied to the vanish.

Step 4

While the semiconductor substrate 101 is placed on the hot plate 107, the temperature of the hot plate 107 is controlled so that the vanish temperature is held at about 200° C. Then, the vanish is heated together with the semiconductor substrate 101, and this state is held at about 30 minutes. In this manner, a third heating process is applied to the vanish.

The solvent contained in the vanish applied on the semiconductor substrate 1 in the step 1 is evaporated (vaporized) and eliminated in accordance with the heating process of the steps 2 to 4 described above. In this manner, the vanish (applied film) is fixed on the semiconductor substrate 1.

After the steps 1 to 4 described above, as in the fifth embodiment, a wiring groove is formed on the surface of the base insulation film 102, the barrier metal 103 and Cu wire 104 are formed therein, and a structure shown in FIG. 5A is provided.

Next, as shown in FIG. 5B, a silicon nitride film 105 is formed on the surfaces of the base insulation film 102, barrier metal 103, and Cu wire 104, and a first semiconductor substrate 108 is formed.

Then, as shown in FIG. 5C, an interlayer insulation film 106 (polymethyl siloxane film) is formed on the surface of the silicon nitride film 105 by using the heating work and the electron beam irradiation work in combination as in the fifth embodiment, and a semiconductor device 109 is formed.

When the thus obtained semiconductor device 109 is observed by using an optical microscope, the oxidization of the surface of the Cu wire 104 is not observed.

In addition, while the steps 2 to 4 are executed, while steps up to the step of forming an interlayer insulation film 106 followed by these steps are executed, and after these steps have been completed, the release of the base insulation film 102 (polymethyl siloxane film), barrier metal 103, Cu wire 104, silicon nitride film 105, and interlayer insulation film 106 (polymethyl siloxane film) is not observed.

In addition, when the resistance value of the Cu wire 104 is measured, the measurements were substantially equal to each other before and after forming the interlayer insulation film 106. Further, when a CMP process is applied to the interlayer insulation film 106, the release of the interlayer insulation film 106 did not occur.

In the present embodiment as well, advantageous effect similar to that according to the fifth embodiment is attained. Further, according to the present embodiment, a polymethyl siloxane film is used as the base insulation film 102, whereby the relative dielectric constant of the semiconductor device 109 can be reduced. That is, the wiring capacity of the semiconductor device 109 is reduced more significantly so that a product between a wiring resistance and an inter-wire capacity can be reduced. In this manner, an operating speed of the semiconductor device 109 and those of various devices using the semiconductor device 109 can be improved more significantly.

(Seventh Embodiment)

FIGS. 5A to 5C are a sectional view showing the steps of manufacturing a semiconductor device according to a seventh embodiment of the present invention. The present embodiment is different from the fifth embodiment in that a polymethyl siloxane film is used as a base insulation film 102, and the polymethyl siloxane film is formed by using a heating work and the electron beam irradiation work in combination.

As shown in FIG. 5A, the base insulation film 102 is formed on a surface of a semiconductor substrate 101. In the present embodiment, a polymethyl siloxane film is formed as the base insulation film 102. The above method of forming the polymethyl siloxane film is formed by using the heating work and the electron beam irradiation work, as in the method of forming the polymethyl siloxane film as an interlayer insulation film 105 described in the fifth embodiment.

Subsequently, a wiring groove in its desired size and shape is formed at a predetermined part on the surface side of the base insulation film (polymethyl siloxane film) 102. Then, the inside of the above wiring groove is filled with the barrier metal 103 and Cu wire 104 in accordance with a conventional CMP process, and the surfaces of the polymethyl siloxane film 11, barrier metal 103, and Cu wire 104 are flattened.

Next, as shown in FIG. 5B, a silicon nitride film 105 is formed on the surfaces of the base insulation film 102, barrier metal 103, and Cu wire 104, as shown in FIG. 5B, and a first semiconductor substrate 21 is formed.

Next, as shown in FIG. 5C, a polymethyl siloxane film that is an interlayer insulation film 106 with its low dielectric rate is formed on the surface silicon nitride film 105 by using the heating work and the electron beam irradiation work, as in the fifth embodiment described previously, and a semiconductor device 109 is formed.

After the polymethyl siloxane film had been formed as the interlayer insulation film 106 described above, when the obtained semiconductor device 109 is observed by using an optical microscope, the oxidization of the surface of the Cu wire 104 is not observed.

In addition, while each of the steps had been executed and after each of the steps has been completed, the release of the barrier metal 103, Cu wire 104, silicon nitride film 105, and interlayer insulation film 106 (polymethyl siloxane film) is not observed. In addition, when the resistance value of the Cu wire 104 is measured, the measurements were equal to each other before and after forming the interlayer insulation film 106. Further, when the CMP technique is applied to the polymethyl siloxane film, the release of the film did not occur.

According to the present embodiment, the polymethyl siloxane film is formed as the base insulation film 102 by using the heating work and the electron beam irradiation in combination, whereby a polymethyl siloxane with its relative dielectric constant lower than that according to the sixth embodiment can be formed. In this manner, the wiring capacity of the semiconductor device 109 can be further reduced, and a product between a wiring resistance and an inter-wire capacity can be reduced more significantly. As a result, an operating speed of the semiconductor device 109 and those of various devices using the semiconductor device 109 can be improved more remarkably.

In addition, according to the present embodiment, the polymethyl siloxane film is formed as the base insulation film 102 by using the heating work and the electron beam irradiation in combination, wherein the above polymethyl siloxane and the semiconductor device 109 including the polymethyl siloxane film can be formed within a short period of time. Therefore, the productivity of the semiconductor device 109 and various devices using the semiconductor device 109 can be improved.

As has been described above, a method for manufacturing a semiconductor device according to the fifth to seventh embodiments each relates to a method for manufacturing a semiconductor device having a Cu wire. In particular, this method contains the step of forming an interlayer insulation film with its low dielectric rate for carrying out the electron beam irradiation. Therefore, the method for manufacturing a semiconductor insulation film according to the fifth to seventh embodiments each can be referred to as Cu integration caused by an EB cured SOG film. Further at least one parameter can be changed as the first embodiment and similar effects can be attained.

(Eighth Embodiment)

According to research made by the Inventor et al, as in the above embodiments, it is found that, when light is externally applied, the polymethyl siloxane film formed by combining the heating and the electron beam irradiation processes emits fluorescence. This is because the heating work and the electron beam irradiation work are carried out at the same time, whereby C—C bonding that can be seen in a structure of an organic resin film can be formed in the polymethyl siloxane film.

In the present embodiment, a description will be given with respect to a method for evaluating the uniformity of in-plane curing of the polymethyl siloxane film by utilizing properties of such polymethyl siloxane film.

First, the steps 1 to 4 of the first embodiment are executed, and a polymethyl siloxane film of 1 micron in thickness is formed. The film forming conditions are the same except that the electron beam energy in the step 4 is 6 keV.

Figure 6:
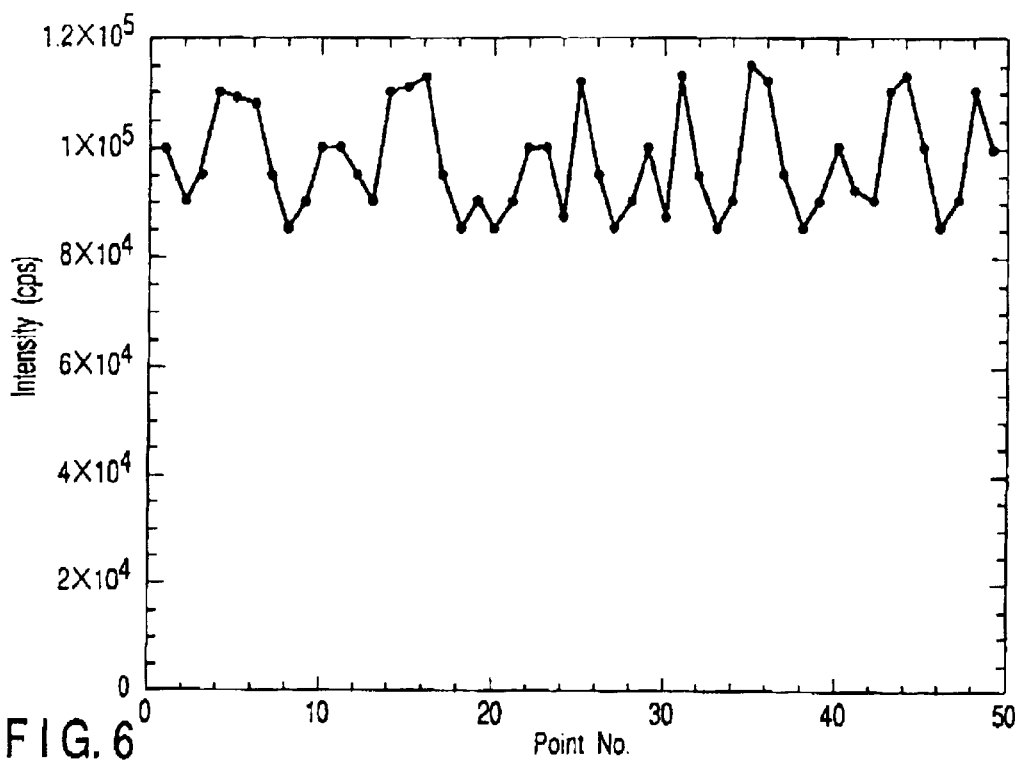
FIG. 6 shows a measurement result of fluorescence intensities emitted from $Ar^+$laser irradiated portions of a polymethyl siloxane film.

Next, $Ar^+$ laser of 514.5 nm are irradiated to 94 parts on the polymethyl siloxane film. At this time, the intensities of fluorescence emitted from the above 94 parts of the polymethyl siloxane film are measured. FIG. 6 shows the measurement result. From a deviation in these fluorescence intensities, the uniformity of in-plane curing of the polymethyl siloxane film is evaluated. The smaller the deviation in fluorescence intensities is, the higher uniformity is.

Conversely, the greater the deviation in fluorescence intensities is, the lower uniformity is.

(Ninth Embodiment)

The present embodiment is different from the eighth embodiment in that the film thickness distribution of a polymethyl siloxane film is evaluated from the intensity distribution of fluorescence emitted from the intensity distribution of fluorescence emitted from the polymethyl siloxane film.

First, the steps 1 to 4 of the first embodiment are executed, and a polymethyl siloxane film of 1 micron in thickness is formed. The electron beam energy in the step 4 is same that of the eighth embodiment.

Next, $Ar^+$laser of 514.5 nm are emitted to 94 parts on the polymethyl siloxane film, and the intensities of fluorescence emitted from the above 94 parts of the polymethyl siloxane film are measured.

Figure 7:
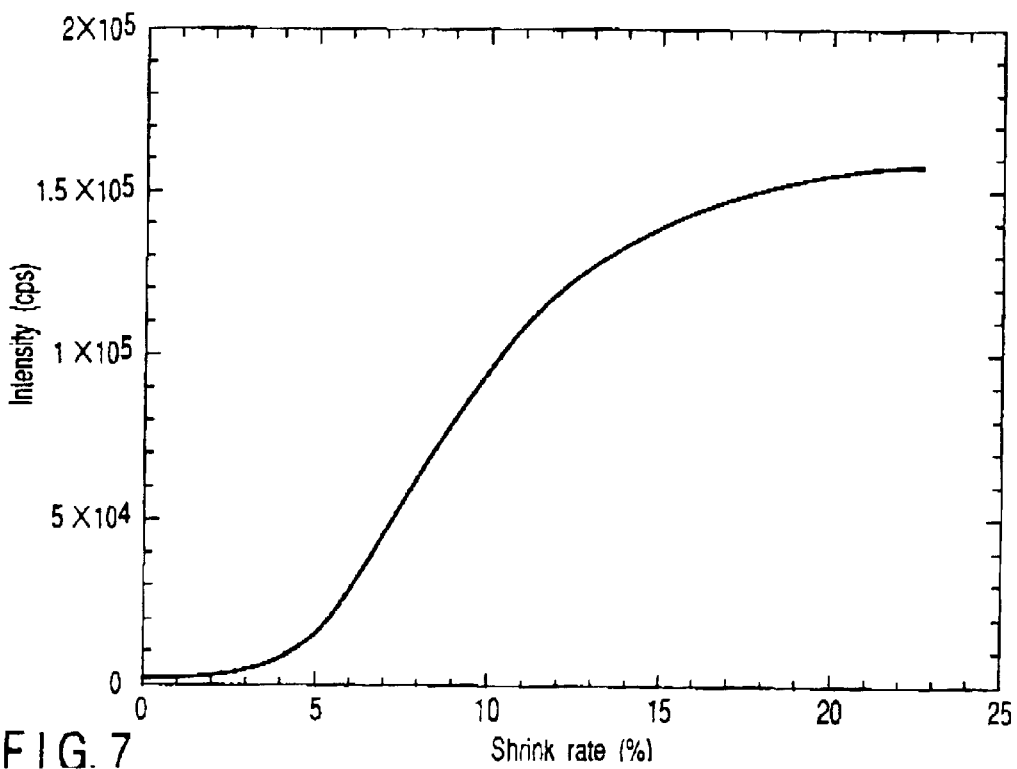
FIG. 7 shows an example of relationship between an intensity of fluorescence emitted from a polymethyl siloxane film and a shrink rate of the polymethyl siloxane film.

There is a relationship between the intensity of fluorescence emitted from the polymethyl siloxane film and a shrink rate of the polymethyl siloxane film, and thus, such relationship is obtained in advance. FIG. 7 shows an example of the relationship. The actual film thickness of a portion emitting fluorescence is obtained as a produce between the design film thickness of the polymethyl siloxane (here, referred to as 1 micron) and the shrink rate corresponding to the intensity of fluorescence at that portion.

Therefore, a product between the design film thickness and the shrink rate that corresponds to the intensity of fluorescence is computed for a respective one of the above 94 parts, whereby the film thickness distribution of the polymethyl siloxane film can be evaluated.

(Tenth Embodiment)

The present embodiment is different from the ninth embodiment in that the film thickness distribution of the polymethyl siloxane film is evaluated while forming the polymethyl siloxane film.

First, the steps 1 to 3 of the first embodiment is executed.

Next, the step 4 of the first embodiment is executed, and $Ar^+$laser of 514.5 nm are irradiated to 94 parts on the polymethyl siloxane film on the way of film forming. Then, the film thickness distribution of the polymethyl siloxane film on the way of film forming is evaluated in accordance with the method described in the ninth embodiment. That is, the polymethyl siloxane film is formed while the film thickness is monitored. As a result of monitoring, if a predetermined film thickness distribution is not obtained, for example, the film forming condition is changed on the way of film forming or film forming is cancelled.

(Eleventh Embodiment)

In the present embodiment, a description will be given with respect to a method utilizing fluorescence from a polymethyl siloxane film for alignment.

First, the steps 1 to 3 of the first embodiment are executed.

Figure 8:
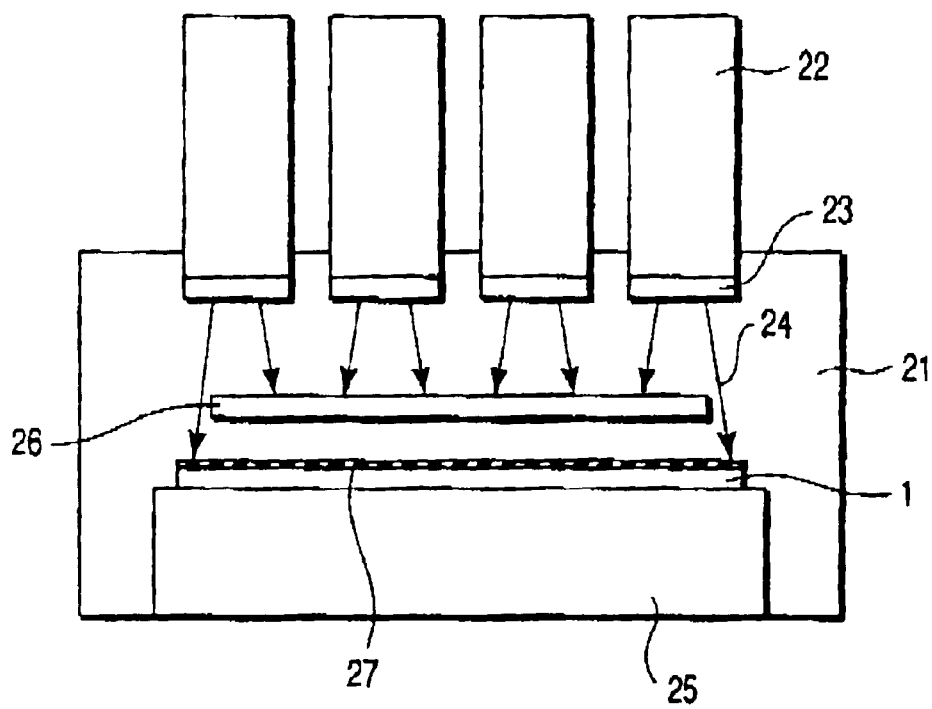
FIG. 8 shows a schematic illustration of an electron beam irradiation apparatus used in the eleventh embodiment of the present invention.

Next, in a reduced pressure atmosphere, a semiconductor substrate is heated by a hot plate of 400° C. for 30 minutes. At this time, as shown in FIG. 8, an electron beam light interrupt mask 26 is disposed upwardly of the semiconductor substrate 1, and electron beam 24 is irradiated to only an alignment portion of a marginal portion of a polymethyl siloxane film 27 formed on the top layer of the semiconductor substrate 1. At this time, the irradiation conditions are 6 KeV in the irradiation quantity and 500 $\mu$C/cm$^2$ in the total irradiation quantity, for example. Further at least one parameter can be changed when heating treatment is carried out with irradiation process, and similar effects as the first embodiment can be attained.

Now, a description will be given with respect to a method for aligning the semiconductor substrate 1 (wafer). As shown in FIG. 14B, $Ar^+$ laser of 514.5 nm are irradiated along the alignment portion the polymethyl siloxane film emits fluorescence. The position of the semiconductor substrate 1 (wafer) is obtained by measuring the portions at which fluorescence is emitted, thereby enabling alignment.

(Twelfth Embodiment)

Figure 9A:
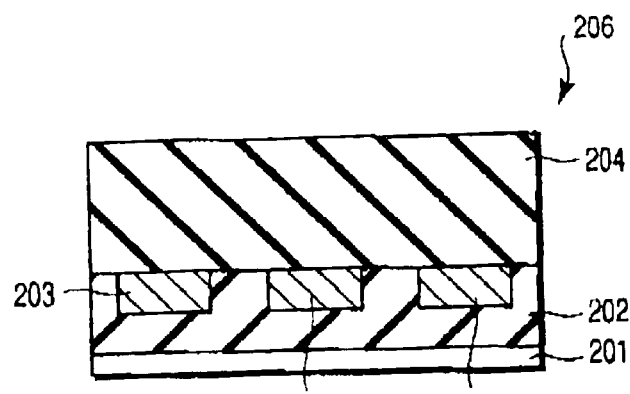
FIGS. 9A–9C show cross sectional views of a manufacturing process of a semiconductor device according to a twelfth embodiment of the present invention.
Figure 9B:
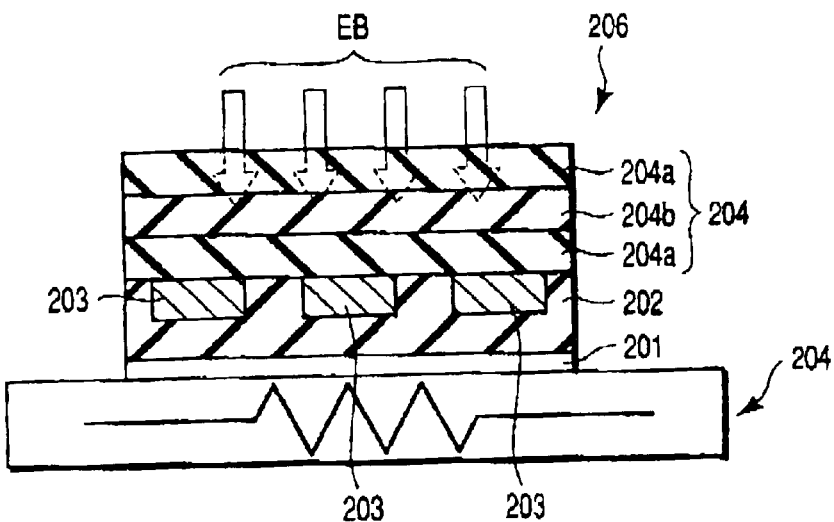
Figure 9C:
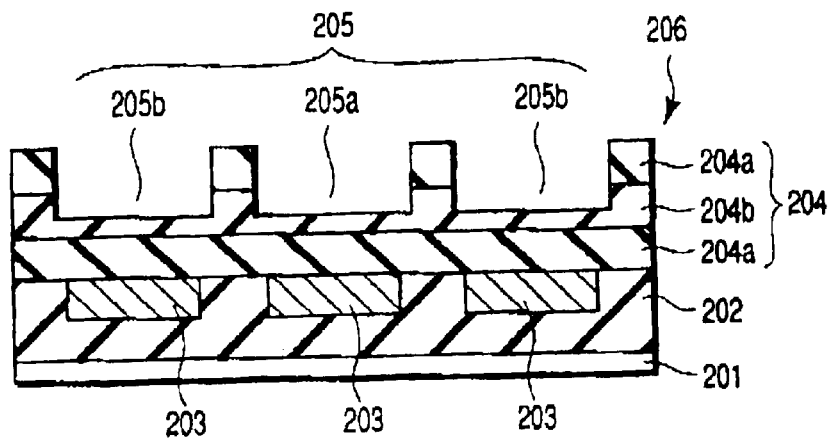

FIGS. 9A to 9C are sectional views each showing the steps of manufacturing a semiconductor device according to a twelfth embodiment of the present invention. A step of manufacturing a semiconductor device according to the present embodiment is characterized by comprising the steps of: forming a second interlayer insulation film 204 on a semiconductor substrate 201; irradiating the interlayer insulation film 204 with the electron beam while applying a heating process to the second interlayer insulation film 204, thereby forming a modified layer 204b partly in the film thickness direction of the interlayer insulation film 204; and etching a surface of an interlayer insulation film 202 having the modified layer 204b formed thereon, thereby forming a wiring groove 205. The size of the semiconductor substrate 201 is 8 inches, for example.

In the present embodiment, as shown in FIGS. 9A to 9C, assume that a first interlayer insulation film (base insulation film) 202 is formed in advance on the surface of the semiconductor substrate 201. The first interlayer insulation film 202 is obtained as a polymethyl siloxane film, for example. The first interlayer insulation film 202 is formed in a manner similar to a method for forming a second interlayer insulation film 204 described later. Further, assume that an embedded wire 203 essentially consisting of a copper (Cu) is formed in advance on the surface of the first interlayer insulation film 202.

In the present embodiment, as a second interlayer insulation film 204, a polymethyl siloxane film that is an insulation film with its low dielectric rate is formed on the first interlayer insulation film 202. The film thickness of the above polymethyl siloxane film is about 1 micron.

Hereinafter, the steps of forming the above polymethyl siloxane film will be described by dividing them into the steps 1 to 4.

Step 1

A liquid-like raw material called a vanish (not shown) obtained by dissolving a film material or a polymethyl siloxane for a precursor of the film material is supplied on a first interlayer insulation film 202. As a method for disposing the above vanish, in the present embodiment, there is employed a coating technique capable of supplying a vanish uniformly with substantially uniform thickness so that a good quality and uniform polymethyl siloxane film is formed. In the vanish coating work, specifically, a coater (not shown) is used as a coating device, for example, whereby a vanish is supplied on the surface of the first interlayer insulation film 202 by a spin coating technique which is one of the coating techniques.

Step 2

A semiconductor substrate 201, as shown in FIG. 9B, is supplied on a hot plate 204 (heating device) having a temperature control mechanism at a posture at which the surface side having a vanish coated thereon is oriented upwardly. A heating device having a temperature control mechanism other than a hot plate 204 may be used.

Then, the temperature of the hot plate 204 is controlled so that the vanish temperature is held at about 80° C., the vanish is heated together with the semiconductor substrate 201 and the first interlayer insulation film 202, and this state is held for about one minute. In this manner, a first heating process is applied.

Step 3

While the semiconductor substrate 201 is placed on the hot plate 204, the temperature of the hot plate 204 is controlled so that the vanish temperature is held at about 200° C. Then, the vanish is heated with the semiconductor substrate 202 and the first interlayer insulation film 202, and this state is held at about one minute. In this manner, a second heating process is applied to the vanish.

According to experiments made by the Inventor et al, as in the step 2 and step 3, a heating method for increasing the vanish temperature in a stepwise manner is employed, thereby clearly making it possible to evaporate a component (for example, solvent) other than polymethyl siloxane that is one of the essential components of the polymethyl siloxane film in the vanish and to effectively fix the coat film.

Step 4

While the semiconductor substrate 201 is placed on the hot plate 204, the substrate is disposed under a reduced pressure atmosphere in which a pressure is reduced to about 0.1 Torr so as to prevent oxidization of a vanish and the polymethyl siloxane film formed based on the vanish. At this time, the atmosphere in which the semiconductor substrate 201 is disposed is filled with a gas essentially consisting of nitrogen ($N_2$) gas.

In this state, the temperature of the hot plate 204 is controlled so that the vanish temperature is held at about 400° C., and a vanish is heated together with the semiconductor substrate 201. In addition, as indicated by the arrow shown in FIG. 9B, the electron beam is irradiated from an electron beam irradiation device (not shown) to the vanish under a condition of about 6 KeV in irradiation energy and about 5000 $\mu C/cm^2$ in total irradiation quantity. The total irradiation quantity is not limited to the above value, i.e. the total irradiation quantity is set that the modified layer 204b can be formed. In this manner, a polymethyl siloxane film that is a second interlayer insulation film 204 is formed on a first interlayer insulation film 202.

As has been described above, in the present embodiment, while a heating process is applied to a vanish only in the step 4 that is a final step of the steps 2 to 4, and the vanish is irradiated with the electron beam.

The reason is to prevent from forming an interlayer insulation film with its low dielectric rate having undesirable characteristics caused by a modification of components other than polymethyl siloxane such as solvent contained in a vanish. The modification occurs by irradiating the vanish that is not fixed on the silicon nitride film 105 with the electron beam.

That is, this is because a polymethyl siloxane film is obtained as an interlayer insulation film 106 with its low dielectric rate having desired characteristics.

The second interlayer insulation film (polymethyl siloxane film) 204 formed through the steps 1 to 4 described above is formed while the film is separated into three layers 204a, 204b, and 204a in which the internal characteristics change along its film thickness direction, as shown in FIG. 9B.

Figure 10:
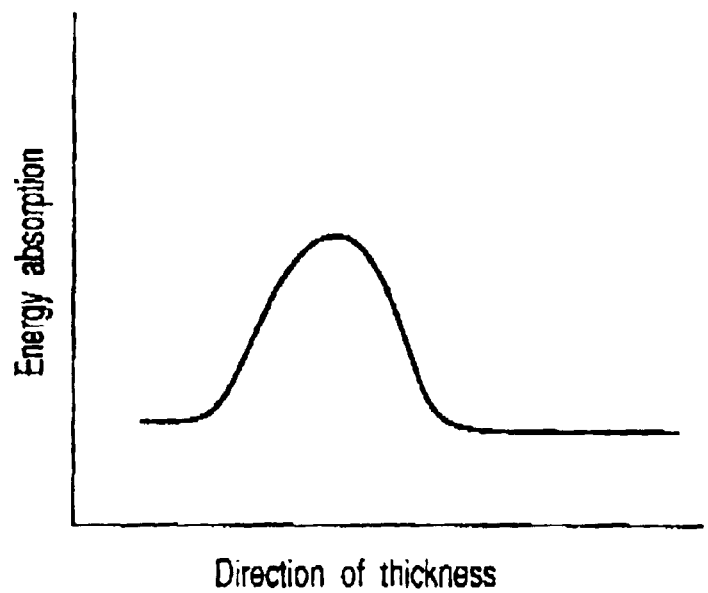
FIG. 10 shows thickness dependency of a quantity of energy absorbed in a polymethyl siloxane film.

In more detail, when a heating process is applied to a vanish in the step 4, the electron beam is irradiated together with the heating process, the characteristic of the polymethyl siloxane film has a distribution of absorption of energy shown as in FIG. 10.

That is, a majority of electron beam energy is absorbed at an intermediate part in the film thickness direction of the polymethyl siloxane film.

Despite the raw material for the polymethyl siloxane film is obtained as a vanish consisting of its single property, the intermediate part in the film thickness direction of the polymethyl siloxane film by which almost of the electron beam energy is absorbed is formed to be modified so as to have properties that differ from both ends in the film thickness direction in which almost no electron beam energy is absorbed.

Specifically, a modified layer (modified portion) 204b being an intermediate portion (intermediate layer) in the film thickness direction of the polymethyl siloxane film modified by the electron beams, is formed so that an etching rate is smaller than that of a non-modified layer (non-modified portion) 204a being both ends (top layer and bottom layer) in the film thickness direction of the polymethyl siloxane film, almost of which has been not modified by the electron beam.

Next, a plurality of wiring grooves 205 (205a, 205b) are formed on the surface of the second interlayer insulation film 204 by means of etching using a CF based gas, for example. The diameter of the wiring groove 205 is about 0.175 micron, for example.

At this time, the plurality of wiring grooves 205 are set so that their deepest part (bottom part) penetrates a portion of the non-modified layer 204a that is an upper layer of the second interlayer insulation film 204, and reaches the modified layer 204b, or alternatively, their deepest part penetrates the modified layer 204b.

When a difference (deviation) in depth between a plurality of wiring groove 205 is investigated, the wiring groove 205b on the marginal part of the semiconductor substrate 201 is slightly deeper by about 5% than the wiring groove 205a on the center of the semiconductor substrate 201. That is, almost no deviation is observed between the wiring groove 205a and the wiring groove 205b. The above value (deviation value) is half of the deviation value (10%) of the wiring grooves formed on the surface of the polymethyl siloxane film (conventional) formed without a vanish being irradiated with the electron beam.

The above error of about 5% in processing dimensions is within an allowable tolerance that can be ignored to maintain at practically proper level the performance of a semiconductor device 206 comprising a polymethyl siloxane film as a second interlayer insulation film 204, the semiconductor device containing wires (not shown) provided at the second interlayer insulation film 204.

In this way, in the polymethyl siloxane film formed by the method of the present embodiment, an etching rate at its marginal part is slightly higher than that of the center by about 5%.

This is because the etching rate of the modified layer 204b is smaller than that of the non-modified layer 204a, and a difference (deviation) in etching rate along the film thickness direction at the marginal part and center part of the second interlayer insulation film 204 is adjusted (corrected) so as to be substantially uniform.

According to experiments made by the Inventor et al, the etching rate of the polymethyl siloxane film (conventional) formed without irradiating a vanish with the electron beam is about 300 nm per minute. On the other hand, the etching rate of the polymethyl siloxane film formed by the method of the present embodiment is about 100 nm per minute. The etching rate of a portion (non-modified layer 204a) other than the modified layer 204b of the polymethyl siloxane film is about 300 nm per minute in the same way as conventionally. In the above experiment, a CP based gas is used as an etching gas.

Therefore, in the polymethyl siloxane film formed by the method of the present embodiment, it is considered that the in-plane deviation of etching rates produced in the non-modified layer 204a having its comparatively high etching rate of about 300 nm per minute is adjusted in the modified layer 204b having its comparatively low etching rate of about 100 nm per minutes, whereby a difference (deviation) in depth of the finally formed wiring grooves 205a and 205b has been reduced.

In addition, according to experiments made by the Inventor et al, even in the case of using an insulation film other than polymethyl siloxane film, as in the step of forming the second interlayer insulation film 204, it is found that the insulation film is formed together with the heating work and the electron beam irradiation work, whereby a part of the above insulation film can be formed to be modified.

Further, by carrying out the heating work and the electron beam irradiation work in combination, as described in another example, it is found that there can be obtained an insulation film having its structure that is different from that obtained by burning the insulation film by only the heating process (for example, an organic silicon oxide film with its low dielectric rate having a structure close to the $SiO_2$ film, for example).

In addition, according to experiments made by the Inventor et al, when a vanish is irradiated with the electron beam in the step 4, a heating process is applied so that the vanish temperature is obtained as a substantially constant temperature within the range of 200° C. or more and not more than 500° C. and preferably about 380° C. to about 400° C., whereby it is evident that there is formed a good quality polymethyl siloxane film such that the semiconductor device 206 can provide practically proper operating performance. In particular, a very good quality polymethyl siloxane film is formed at about 400° C.

In addition, according to experiments made by the Inventor et al, in the step 4, an irradiation quantity is set so as to obtain a substantially constant value at the total irradiation quantity about 5000 $\mu C/cm^2$ or more, and a vanish is irradiated with the electron beam, whereby it is evident that a good quality polymethyl siloxane film is formed such that the semiconductor device 206 can provided practically proper operating performance. In particular, a very good quality polymethyl siloxane film is formed at the total irradiation quantity about 5000 $\mu C/cm^2$.

Similarly, according to experiments made by the Inventor et al, in the step 4, acceleration energy is set so as to obtain a substantially constant value within the range of about 1 keV to 15 keV, and a vanish is irradiated with the electron beam, whereby it is evident that a good quality polymethyl siloxane film is formed such that the semiconductor device 206 can provide practically proper operating performance. In particular, a very good quality polymethyl siloxane film is formed at about 6 keV.

Further, according to experiments made by the Inventor et al, in the step 4, a vanish is disposed in a pressure reducing atmosphere within a predetermined range, thereby clearly making it possible to form a good quality polymethyl siloxane film such that the semiconductor device 206 can provide practically proper operating performance. In particular, a vanish is disposed in a nitrogen atmosphere set to a substantially constant pressure reducing value of about 0.1 Torr, whereby a very good quality polymethyl siloxane film is formed.

As has been described above, according to the present embodiment, in the step of forming a polymethyl siloxane film that is a second interlayer insulation film 204, the heating process and the electron beam irradiation process are used in combination, whereby a modified layer 204b with its etching rate lower than both ends of the layer can be easily formed at an intermediate part in the film thickness direction of the polymethyl siloxane film.

In this manner, of both ends in the film thickness direction of the polymethyl siloxane (top and back faces of the polymethyl siloxane film), a deviation in etching rate in the end face to be etched (in the surface of the polymethyl siloxane film) is easily reduced in the modified layer 204b. As a result, a difference in depth between the wiring groves 205a and 205b due to a difference in etching rate is easily reduced.

That is, according to the present embodiment, processing precision due to etching of the polymethyl siloxane film can be easily improved. In this manner, the yields of the semiconductor device 206 can be improved.

In addition, according to the present embodiment, the heat process and the electron beam irradiation process are used in combination, whereby the electrical performance (quality) of the polymethyl siloxane film can be easily improved. In this manner, the electrical performance of the entire semiconductor device 206 can be easily improved. In addition, a variety of semiconductor devices with high throughputs can be produced by using the semiconductor device 206.

In addition, as a first interlayer insulation film 202, there may be used a polymethyl siloxane film formed in a manner similar to that of the second interlayer insulation film 204. The laminate film of these polymethyl siloxane films has a practically sufficient strength. In addition, the laminate film of the above polymethyl siloxane films has a substantially uniform, good quality which does not prevent the performance of the semiconductor device 206. This applies to a case of using a polymethyl siloxane film made of three or more layers.

In addition, a modified layer 204b may be formed at a position such that a deviation of its processing dimensions can be adjusted according to the depth of a desired wiring groove.

Although embodiments or the present invention each have been described above, the present invention is not limited to these embodiments. For example, although the above embodiments each has shown a polymethyl siloxane film as an example of an insulation film, the present invention is applicable to film forming of other insulation films. For example, there can be exemplified a coated organic silicon oxide film (SOG) having Si—C bonding (in general, Si—$CH_3$ bonding) in its film, for example, an organic film, or a insulation film obtained by curing the coated solution by a heat or the like. From another point of view, there can be used an insulation film essentially consisting of a material of which film forming reaction is accelerated by using the heating work and the electron beam irradiation work in combination, the material being free of degrading a quality.

In addition, although a spin coating technique has been used as a vanish coating technique in the above embodiments each, another coating technique such as nozzle scan coating technique may be used. In forming an insulation film by using such coating technique, instead of increasing a temperature of the vanish in a stepwise manner, thereby evaporating a solvent, the vanish is disposed under a reduced pressure atmosphere, and the solvent is evaporated, whereby the above insulation film may be fixedly bonded with a substrate.

Further, although the above embodiments each has shown an interlayer insulation film with its low dielectric rate as an example of an insulation film, the present invention is applicable to another insulation film such as a gate insulation film.

Furthermore, the sequence of a process for forming a coat film is not limited to that shown in the above embodiments each. The sequence of carrying out the steps of heat treatment plus the electron beam irradiation treatment process; the count of carrying out heat treatment and the electron beam irradiation treatment; and heat treatment and the electron beam irradiation treatment conditions can be changed as required according to type or use of the coat film. The electron beam irradiation conditions include, for example, the electron beam energy, irradiation dose, atmosphere, and substrate temperature during irradiation.

Otherwise, a variety of settings such as the vanish heating temperature and heating time, a pressure reducing value of the atmosphere can be changed as required, similarly. That is, the value of settings may be provided in a variety of combinations according to manufacturing environment as long as the performance of the semiconductor device can be achieved at a desired level.

In addition, a material used for wiring may be an element other than Cu. The wiring resistance may be sufficiently low to an extent such that the operating speed of the semiconductor device is not reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

preparing a substrate to be treated; and forming an insulation film above the substrate, which includes;

applying an insulation film raw material above the substrate, the insulation film raw material including a substance or a precursor of the substance, the insulation film comprising the substance; and curing the insulation film raw material by irradiating an electron beam on the substrate while heating the substrate at a first heating temperature and holding the first heating temperature constant in a reactor chamber, and causing to change temperature of the substrate from the first heating temperature to a second heating temperature different from the first heating temperature and holding the second heating temperature constant during the electron beam irradiating process, wherein the second heating temperature is lower than the first heating temperature.

2. A method of manufacturing a semiconductor device according to claim 1, wherein the temperature of the substrate is changed in a range from not less than 200° C. to not more than 500° C.

3. A method of manufacturing a semiconductor device according to claim 1, further comprising:

at least one of pre-heat treatment which carried out before curing the insulation film raw material and post-heat treatment which carried out after curing the insulation film raw material in the reactor chamber, changing at least one of parameter selected from the group consisting of pressure in the reactor chamber, temperature of the substrate, type of gas having the substrate exposed thereto, flow rate of gas introduced into the reactor chamber, and position of the substrate when the at least one of the pre-heat treatment and the post-heat treatment is being carried out.

4. A method of manufacturing a semiconductor device according to claim 3, wherein the pressure in the reactor chamber is changed in a range from higher than 0 Torr to not more than 40 Torr when the at least one of the pre-heat treatment and the post-heat treatment is being carried out.

5. A method of manufacturing a semiconductor device according to claim 3, wherein the temperature of the substrate is changed in a range from not less than 200° C. to not more than 500° C. when the at least one of the pre-heat treatment and the post-heat treatment is being carried out.

6. A method of manufacturing a semiconductor device according to claim 3, wherein type of gas having the substrate exposed is changed among a nitrogen gas, a rare gas, a mixture these gases whose oxygen concentration is not higher than 100 ppm when the at least one of the pre-heat treatment and the post-heat treatment is being carried out.

7. A method of manufacturing a semiconductor device according to claim 3, wherein the flow rate of gas having the substrate exposed thereto, the gas being introduced into the reactor chamber, is changed in a range of from higher than 0 slm to not more than 25 slm when the at least one of the pre-heat treatment and the post-heat treatment is being carried out.

8. A method of manufacturing a semiconductor device according to claim 3, wherein the position of the substrate is changed in a range from not less than 50 mm to not more than 120 mm in distance from an electron beam generating section that generates the electron beam when the at least one of the pre-heat treatment and the post-heat treatment is being carried out.

9. A method of manufacturing a semiconductor device according to claim 1, wherein the insulation film is an organic silicon oxide film.

10. A method of manufacturing a semiconductor device according to claim 1, wherein the insulation film is a polymethylsiloxane film.

11. A method of manufacturing a semiconductor device according to claim 1, further comprising; embedding a wire whose main material is Cu on a surface of the insulation film.

12. A method of manufacturing a semiconductor device comprising:

preparing a substrate to be treated;

forming an insulation film above the substrate, which includes applying an insulation film raw material above the substrate, the insulation film raw material including a substance or a precursor of the substance, the insulation film comprising the substance, curing the insulation film raw material by irradiating an electron beam on the substrate while heating the substrate in a reactor chamber, and changing at least one of the parameters selected from the group consisting of pressure in the reactor chamber, type of gas having the substrate exposed thereto, flow rate of a gas introduced into the reactor chamber, position of the substrate, and quantity of electrons incident to the substrate per unit time when the electron beam is being irradiated on the substrate.

13. A method of manufacturing a semiconductor device according to claim 12, wherein the pressure in the reactor chamber is changed in a range from higher than 0 Torr to not more than 40 Torr.

14. A method of manufacturing a semiconductor device according to claim 12, wherein type of gas having the substrate exposed thereto is changed among a nitrogen gas, a rare gas, a reduced gas and a mixture of these gases, and whose oxygen concentration is not higher than 100 ppm.

15. A method of manufacturing a semiconductor device according to claim 12, wherein the flow rate of gas having the substrate exposed thereto, the gas being introduced into the reactor chamber, is changed in a range of from higher than 0 slm to not more than 25 slm.

16. A method of manufacturing a semiconductor device according to claim 12, wherein the position of the substrate is changed in a range from not less than 50 mm to not more than 120 mm in distance from an electron beam generating section that generates the electron beam.

17. A method of manufacturing a semiconductor device according to claim 12, wherein the quantity of electrons incident to the substrate per unit time is changed in a range from not less than 4 $\mu C/cm^2 \cdot sec$ to not more than 10 $\mu C/cm^2 \cdot sec$.

18. A method of manufacturing a semiconductor device according to claim 12, comprising:
   at least one of pre-heat treatment which carried out before curing the insulation film raw material and post-heat treatment which carried out after curing the insulation film raw material in the reactor chamber, changing at least one of the parameters selected from the group consisting of pressure in the reactor chamber, temperature of the substrate, type of gas having the substrate exposed thereto, flow rate of gas introduced into the reactor chamber, and position of the substrate when the at least one of the pre-heat treatment and the post-heat treatment is being carried out.

19. A method of manufacturing a semiconductor device according to claim 18, wherein the pressure in the reactor chamber is changed in a range from higher than 0 Torr to not more than 40 Torr when the at least one of the pre-heat treatment and the post-heat treatment is being carried out.

20. A method of manufacturing a semiconductor device according to claim 18, wherein the temperature of the substrate is changed in a range form not less than 200° C. to not more than 500° C. when the at least one of the pre-heat treatment and the post-heat treatment is being carried out.

21. A method of manufacturing a semiconductor device according to claim 18, wherein type of gas having the substrate exposed is changed among a nitrogen gas, a rare gas, and a mixture these gases whose oxygen concentration is not higher that 100 ppm when the at least one of the pre-heat treatment and the post-heat treatment is being carried out.

22. A method of manufacturing a semiconductor device according to claim 18, wherein the flow rate of gas having the substrate exposed thereto, the gas being introduced into the reactor chamber, is changed in a range of form higher than 0 slm to not more than 25 slm when the at least one of the pre-heat treatment and the post-heat treatment is being carried out.

23. A method of manufacturing a semiconductor device according to claim 18, wherein the position of the substrate is changed in a range from not less than 50 mm to not more than 120 mm in distance from an electron beam generating section that generates the electron beam when the at least one of the pre-heat treatment and the post-heat treatment is being carried out.

24. A method of manufacturing a semiconductor device according to claim 12, wherein the insulation film is an organic silicon oxide film.

25. A method of manufacturing a semiconductor device according to claim 12, wherein the insulation film, is a polymethylsiloxane film.

26. A method of manufacturing a semiconductor device according to claim 12, further comprising; embedding a wire whose main material is Cu on a surface of the insulation film.

27. A method of manufacturing a semiconductor device comprising:
   preparing a substrate to be treated; and
   forming an insulation film above the substrate, which includes;
   applying an insulation film raw material above the substrate, the insulation film raw material including a substance or a precursor of the substance, the insulation film comprising the substance;
   heating the substrate to a first heating temperature and holding the first heating temperature constant; and
   curing the insulation film raw material by irradiating an electron beam on the substrate while heating the substrate at a second heating temperature different from the first heating temperature in a reactor chamber and holding the second heating temperature constant, and changing temperature of the substrate from the second heating temperature to a third heating temperature different form the second heating temperature and holding the third heating temperature constant during the electron beam irradiating process,
   wherein the third heating temperature is lower than the second heating temperature.

* * * * *

UNITED STATES PATENT AND TRADEMARK OFFICE
CERTIFICATE OF CORRECTION

PATENT NO. : 6,746,969 B2
DATED : June 8, 2004
INVENTOR(S) : Shimada et al.

It is certified that error appears in the above-identified patent and that said Letters Patent is hereby corrected as shown below:

Column 29,
Line 36, change "includes;" to -- includes: --.
Line 63, change "of parameter" to -- of the parameters --.

Column 30,
Line 41, change "comprising;" to -- comprising: --.

Column 31,
Line 38, change "form" to -- from --.

Column 32,
Lines 2 and 43, change "form" to -- from --.
Line 18, change "film, is" to -- film is --.
Line 21, change "comprising;" to -- comprising: --.
Line 28, change "includes;" to -- includes: --.

Signed and Sealed this

Fourteenth Day of December, 2004

JON W. DUDAS
*Director of the United States Patent and Trademark Office*